US012805082B2

(12) United States Patent
Kim

(10) Patent No.: US 12,805,082 B2
(45) Date of Patent: Nov. 17, 2026

(54) DISPLAY DEVICE HAVING DIFFERENT REFLECTIVE LAYERS

(71) Applicant: LG DISPLAY CO., LTD., Seoul (KR)

(72) Inventor: Hyunwoo Kim, Bucheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 346 days.

(21) Appl. No.: 18/588,806

(22) Filed: Feb. 27, 2024

(65) Prior Publication Data

US 2024/0290923 A1 Aug. 29, 2024

(30) Foreign Application Priority Data

Feb. 28, 2023 (KR) ........................ 10-2023-0027195

(51) Int. Cl.
*H10H 20/856* (2025.01)
*H10W 90/00* (2026.01)

(52) U.S. Cl.
CPC .......... *H10H 20/856* (2025.01); *H10W 90/00* (2026.01)

(58) Field of Classification Search
CPC ..... H10W 90/00; H10D 86/021; H10H 20/84; H10H 20/857
See application file for complete search history.

(56) References Cited

U.S. PATENT DOCUMENTS

| | | | | |
|---|---|---|---|---|
| 2013/0071973 | A1* | 3/2013 | Beak | H10D 86/0231 438/158 |
| 2018/0017730 | A9* | 1/2018 | Zhou | G02B 6/0043 |
| 2019/0131365 | A1* | 5/2019 | Jung | H10D 86/451 |
| 2021/0242380 | A1* | 8/2021 | Kim | H10H 20/857 |
| 2022/0384401 | A1* | 12/2022 | Bok | H10H 20/856 |

* cited by examiner

*Primary Examiner* — Brian Turner
(74) *Attorney, Agent, or Firm* — Birch, Stewart, Kolasch & Birch, LLP

(57) ABSTRACT

A display device including a display panel including a plurality of sub pixels, in which each sub pixel includes at least one light emitting diode, at least one transistor configured to drive the at least one light emitting diode to emit light and a reflection plate including a first part disposed below and overlapping the at least one light emitting diode and a second part extending from the first part, and wherein the first part of the reflection plate includes a material having a higher reflectance than a material of the second part extending from the first part.

25 Claims, 11 Drawing Sheets

DISPLAY DEVICE HAVING DIFFERENT REFLECTIVE LAYERS

CROSS-REFERENCE TO RELATED APPLICATIONS

This application claims the benefit under 35 U.S.C. § 119 (a) to Korean Patent Application No. 10-2023-0027195 filed on Feb. 28, 2023, in the Korean Intellectual Property Office, all of which are hereby expressly incorporated by reference into the present application.

BACKGROUND

Field

The present disclosure relates to a display device, and more particularly, to a display device using a light emitting diode (LED).

Description of the Related Art

Display devices for a computer monitor, a television, a cellular phone, or the like, include an organic light emitting display (OLED) device, which is a self-emitting device, a liquid crystal display (LCD) device requiring a separate light source, and the like.

Further, a display device including a light emitting diode (LED) is attracting attention as a next generation display device. In more detail, the LED is formed of an inorganic material, has an excellent reliability and a long lifespan. Further, the LED has a fast lighting speed, excellent luminous efficiency, and a strong impact resistance so that a stability is excellent and an image having a high luminance can be displayed.

SUMMARY

Accordingly, one object of the present disclosure is to provide a display device including an LED and reflection plate satisfying both an optical and electrical characteristic.

According to one aspect, the present disclosure provides a display device including a substrate with an active area including a plurality of sub pixels and a non-active area. The display device further includes a plurality of light emitting diodes disposed in each sub pixel. In addition, the display device further includes a plurality of transistors disposed in each sub pixel, and a plurality of reflection plates disposed below the light emitting diodes in the sub pixels. Some of the reflection plates include a first part overlapping the light emitting diode and a second part extending from the first part, in which the first and second parts are formed of different materials.

According to an embodiment of the present disclosure, even though a material having a high reflectance is used for the reflection plate, formation of an oxide film of the reflection plate is suppressed to suppress the increase in a resistance of the reflection plate. The effects according to the present disclosure are not limited to the contents exemplified above, and more various effects are included in the present specification.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
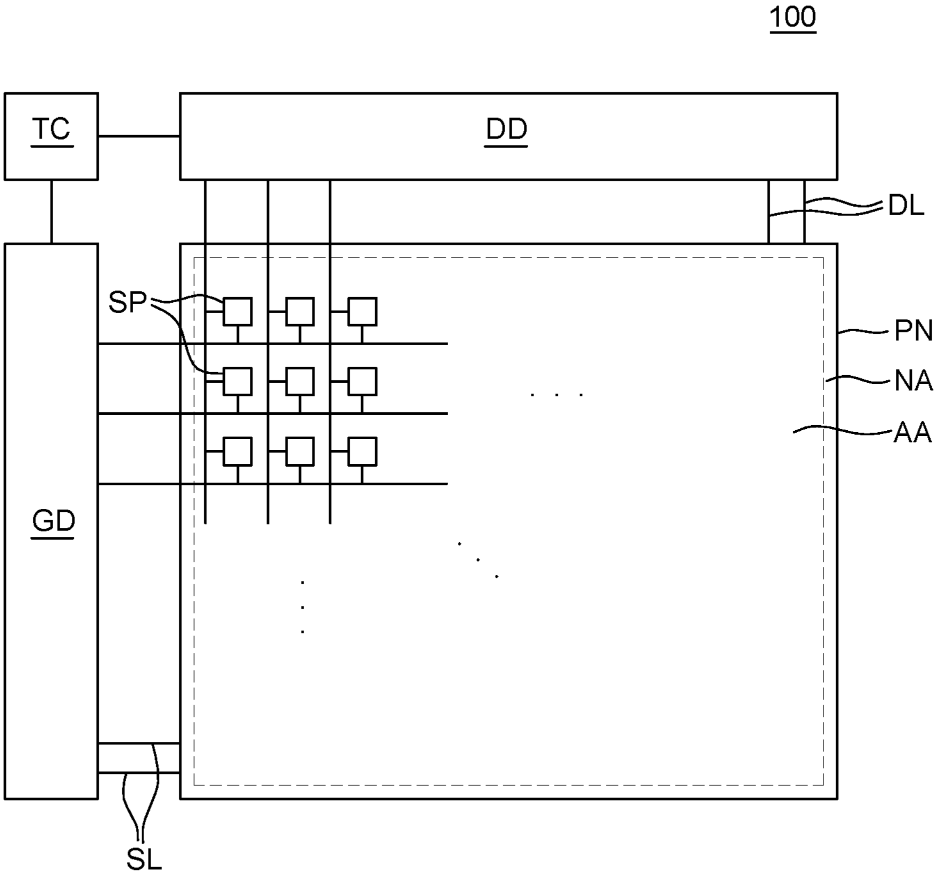
FIG. 1 is a schematic diagram of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated. When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween. Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification. A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2A:
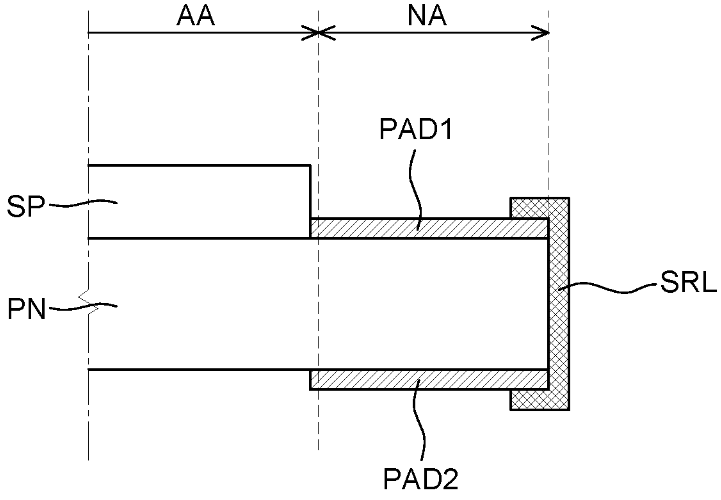
FIG. 2A is a partial cross-sectional view of a display device according to an exemplary embodiment of the present disclosure.
Figure 2B:
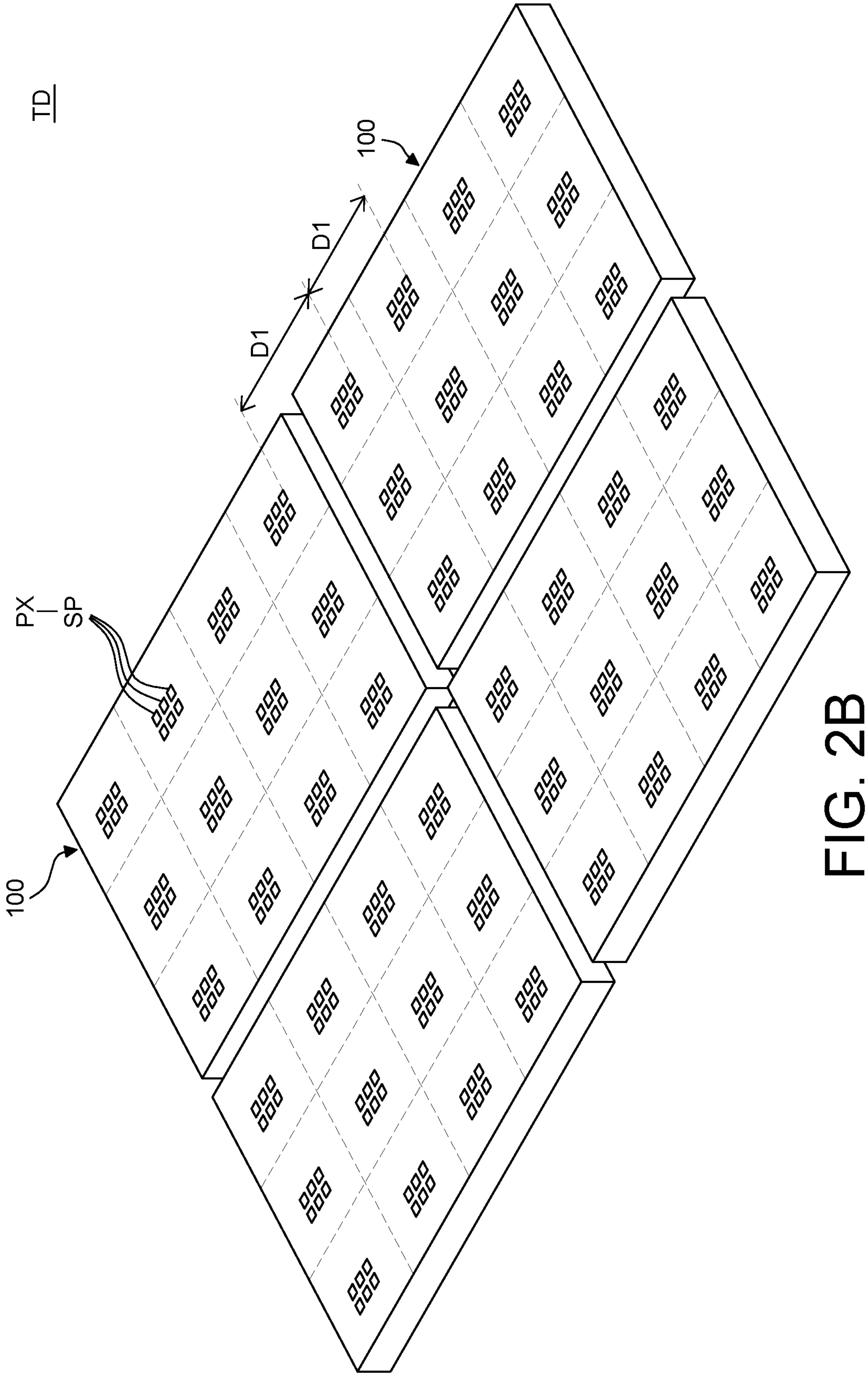
FIG. 2B is a perspective view of a tiling display device according to an exemplary embodiment of the present disclosure.

In particular, FIG. 1 is a schematic diagram of a display device 100, FIG. 2A is a partial cross-sectional view of a display device, and FIG. 2B is a perspective view of a tiling display device TD according to an exemplary embodiment of the present disclosure. FIG. 1 illustrates the display device 100 including a display panel PN, a gate driver GD, a data driver DD, and a timing controller TC.

Referring to FIG. 1, the display device 100 includes a display panel PN including a plurality of sub pixels SP. Further, the gate driver GD and the data driver DD supply various signals to the display panel PN. In addition, the timing controller TC controls the gate driver GD and the data driver DD.

Further, the gate driver GD supplies scan signals to scan lines SL in accordance with gate control signals supplied from the timing controller TC. In addition, FIG. 1 illustrates one gate driver GD spaced apart from one side of the display panel PN, but the number of the gate drivers GD and the placement thereof are not limited thereto.

Further, the data driver DD converts image data input from the timing controller TC into a data voltage using a reference gamma voltage in accordance with data control signals supplied from the timing controller TC. The data driver DD can supply the converted data voltage to the plurality of data lines DL.

In addition, the timing controller TC aligns the input image data and supplies the image data to the data driver DD. The timing controller TC also generates a gate control signal and a data control signal using input synchronization signals, such as a dot clock signal, a data enable signal, and horizontal/vertical synchronization signals. Also, the timing controller TC supplies the generated gate control signal and data control signal to the gate driver GD and the data driver DD, respectively, to control the gate driver GD and the data driver DD.

In addition, the display panel PN displays images to the user and includes the plurality of sub pixels SP. In the display panel PN, the scan lines SL and the data lines DL intersect each other and corresponding sub pixels SP are connected to the scan lines SL and the data lines DL, respectively. In addition, each sub pixel SP can be connected to a high potential power line, a low potential power line, a reference line, and the like.

As shown in FIG. 1, the display panel PN includes an active area AA and a non-active area NA enclosing the active area AA. In particular, the active area AA is where images are displayed in the display device. That is, the active area AA includes a plurality of sub pixels SP configuring a plurality of pixels PX and a circuit for driving the sub pixels SP. The sub pixel SP is a minimum unit configuring the active area AA and n sub pixels SP can form one pixel PX. In addition, each sub pixel SP incudes a light emitting diode, a thin film transistor for driving the light emitting diode, and the like. The light emitting diodes can be defined in different ways depending on the type of the display panel PN. For example, when the display panel PN is an inorganic light emitting display panel, the light emitting diode can be an LED or a micro LED.

The active area AA also includes wiring lines transmitting various signals to the sub pixels SP. For example, as shown in FIG. 1, the wiring lines includes data lines DL supplying a data voltage to each sub pixel SP, scan lines SL supplying a scan signal to each sub pixel SP, and the like. As shown, the scan lines SL extend in one direction in the active area AA and are connected to the sub pixels SP, and the data lines DL extend in a different direction in the active area AA and are connected to the sub pixels SP. In addition, in the active area AA, a low potential power line, a high potential power line, and the like can be further disposed.

Further, the non-active area NA is where images are not displayed and is defined as an area extending from the active area AA. The non-active area NA includes a link line for transmitting a signal to the sub pixel SP of the active area AA, a pad electrode, a driving IC, such as a gate or data driver IC, etc. In addition, the non-active area NA can be located on a rear surface of the display panel PN, that is, on a surface on which the sub pixels SP are not disposed or alternatively can be omitted.

Further, as shown in FIG. 1, the display panel 100 includes the gate driver GD, the data driver DD, and the timing controller TC. For example, the gate driver GD can be mounted in the non-active area NA in a gate in panel (GIP) manner or mounted between the sub pixels SP in the active area AA in a gate in active area (GIA) manner. Also, the data driver DD and the timing controller TC can be formed in a separate flexible film and printed circuit board. The data driver DD and the timing controller TC can also be electrically connected to the display panel PN by bonding the flexible film and the printed circuit board to the pad electrode disposed in the non-active area NA of the display panel PN.

Further, when the gate driver GD is mounted in the GIP manner and the data driver DD and the timing controller TC transmit a signal to the display panel PN through a pad electrode of the non-active area NA, the size of the non-active area NA increases. Accordingly, a bezel size of the display device is increased.

In contrast, when the gate driver GD is mounted in the active area AA in the GIA manner and a side line SRL connecting the signal line on the front surface of the display panel PN to the pad electrode on a rear surface of the display panel PN is formed to bond the flexible film and the printed circuit board onto a rear surface of the display panel PN, the non-active area NA can be minimized on the front surface of the display panel PN. That is, when the gate driver GD, the data driver DD, and the timing controller TC are connected to the display panel PN as described above, a zero bezel can be implemented.

Specifically, referring to FIGS. 2A and 2B, the non-active area NA of the display panel PN includes pad electrodes for transmitting various signals to the sub pixels SP. For example, the non-active area NA on the front surface of the display panel PN includes first pad electrodes PAD1 for transmitting a signal to the sub pixels SP. As shown in FIG. 2A, the non-active area NA on the rear surface of the display panel PN includes a second pad electrode PAD2 electrically connected to a driving component, such as a flexible film and the printed circuit board. That is, only the first pad electrode PAD1 is disposed on the front surface of the display panel PN on which images are displayed.

Thus, various signal lines connected to the sub pixels SP, for example, a scan line SL or a data line DL can extend from the active area AA to the non-active area NA to be electrically connected to the first pad electrode PAD1.

That is, as shown in FIG. 2A, the side line SRL is disposed along a side surface of the display panel PN. The side line SRL thus can electrically connect the first pad electrode PAD1 on the front surface of the display panel PN and the second pad electrode PAD2 on the rear surface of the display panel PN. Therefore, a signal from a driving component on the rear surface of the display panel PN can be transmitted to the sub pixels SP through the second pad electrode PAD2, the side line SRL, and the first pad electrode PAD1. Accordingly, a signal transmitting path from the front surface of the display panel PN to the side surface and the rear surface is formed to minimize an area of the non-active area NA on the front surface of the display panel PN.

Referring to FIG. 2B, a tiling display device TD having a large screen size can be implemented by connecting a plurality of display devices 100. As illustrated in FIG. 2B, when the tiling display device TD is implemented using a display device 100 with a minimized bezel, a seam area in which an image between the display devices 100 is not displayed is minimized so that a display quality is improved.

For example, the sub pixels SP form one pixel PX and a distance D1 between an outermost pixel PX of one display device 100 and an outermost pixel PX of another display device 100 adjacent to one display device 100 can be implemented to be equal to a distance D1 between pixels PX in one display device 100. Accordingly, a constant distance D1 between pixels PX between the display devices 100 is configured to minimize the seam area.

Figure 3:
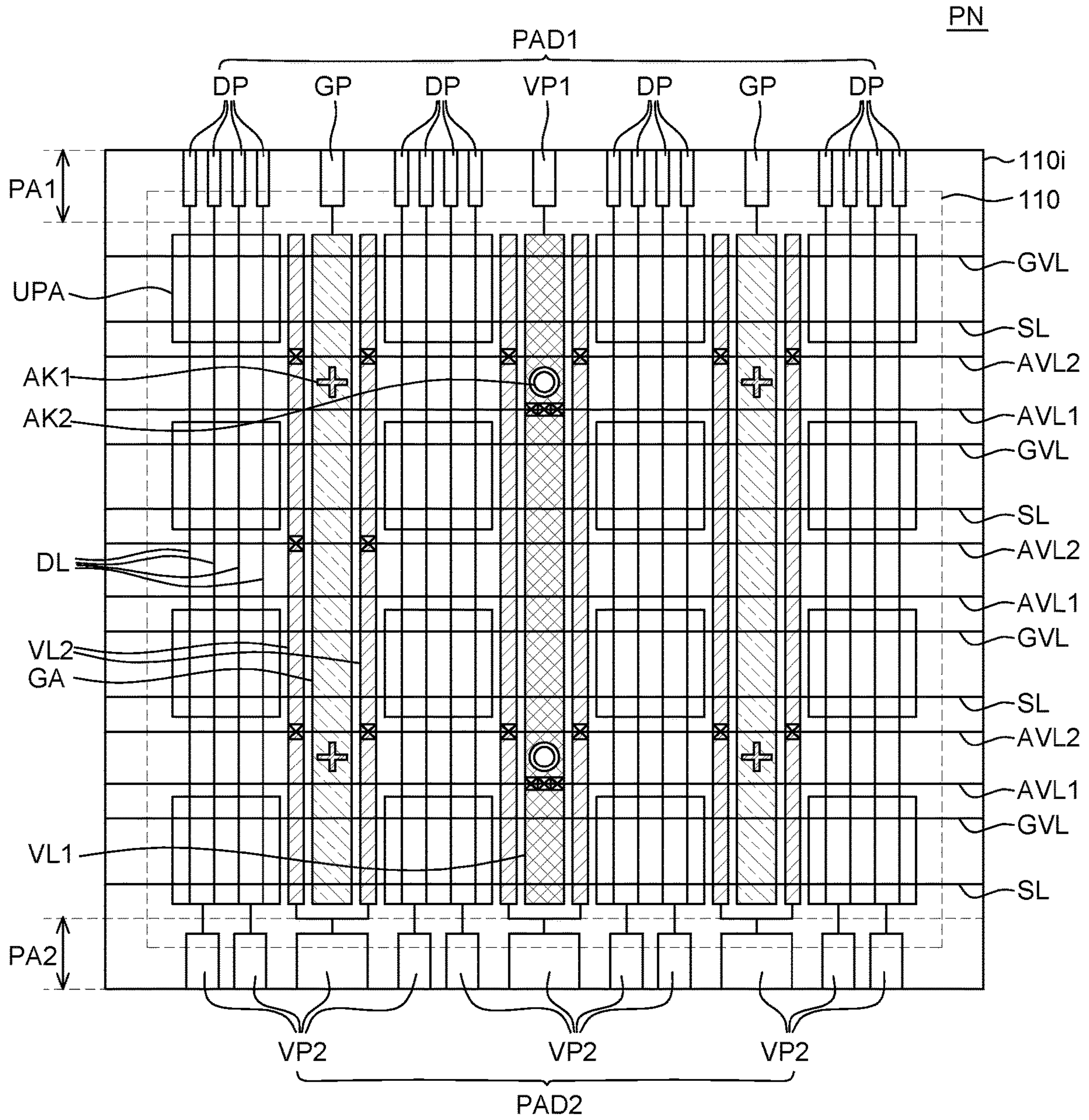
FIG. 3 is a plan view of a display panel of a display device according to an exemplary embodiment of the present disclosure.
Figure 4A:
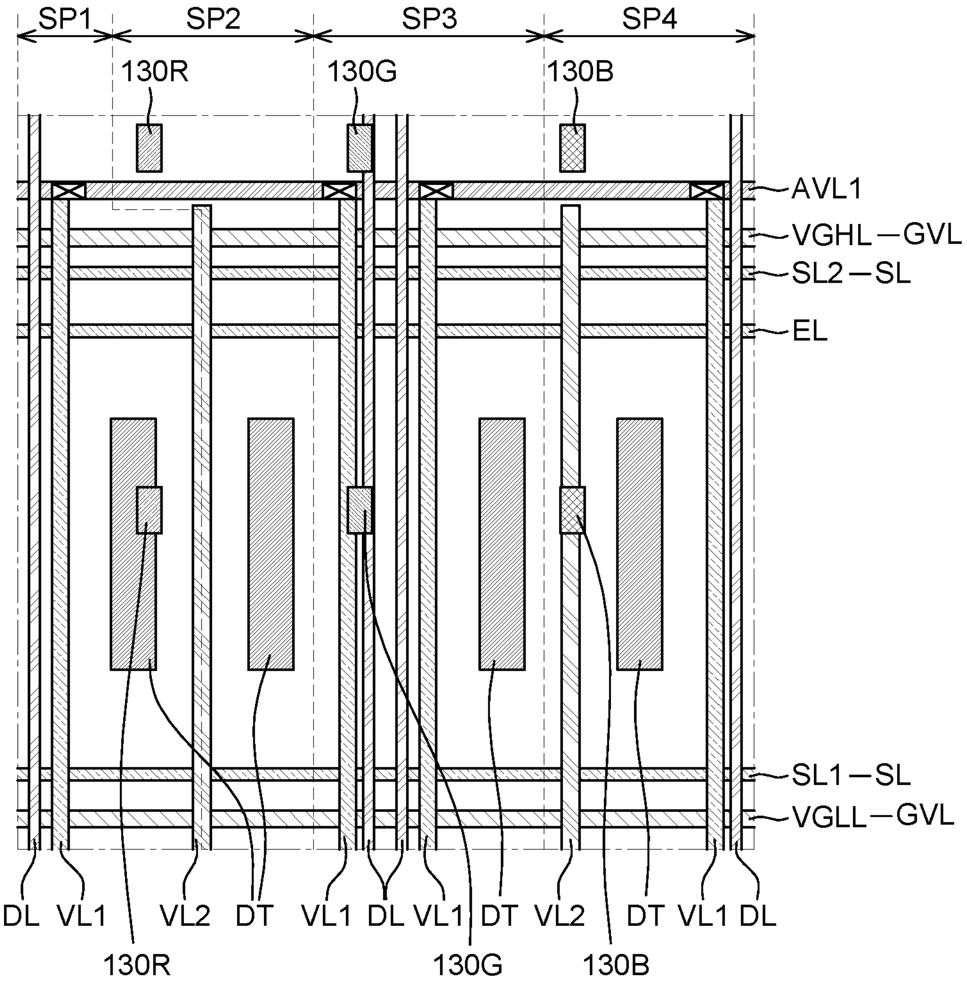
FIGS. 4A and 4B are plan views illustrating a pixel area of a display device according to an exemplary embodiment of the present disclosure.
Figure 4B:
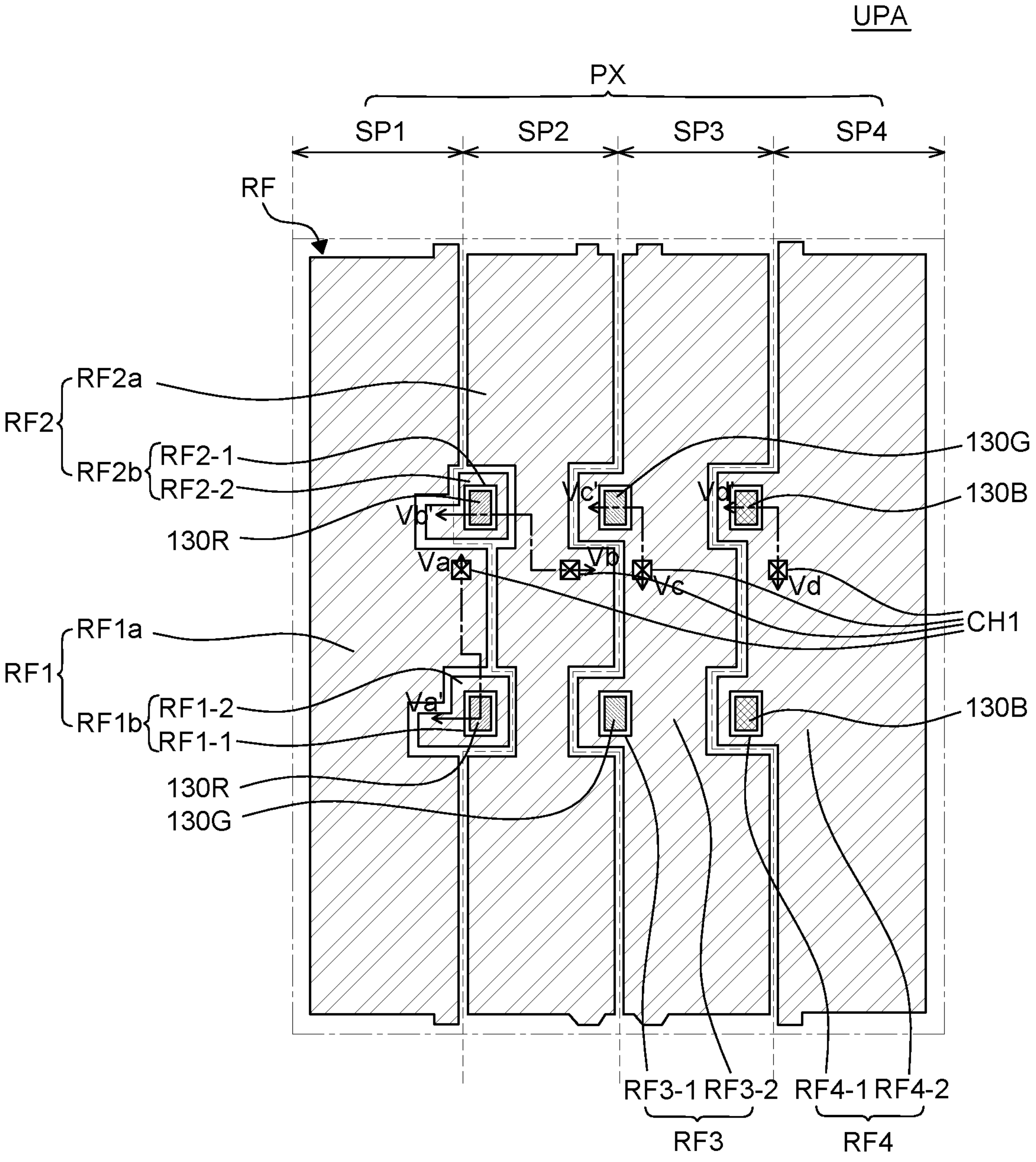

Next, FIG. 3 is a plan view of a display panel of a display device, FIGS. 4A and 4B are plan views illustrating a pixel area of a display device, and FIGS. 5A to 5D are cross-sectional views of a display device according to an exemplary embodiment of the present disclosure. Also, FIG. 4A illustrates the light emitting diodes 130, a driving transistor DT of the pixel circuit, and a plurality of wiring lines are illustrated, and FIG. 4B illustrates a plurality of reflection plates and a plurality of light emitting diodes 130.

First, referring to FIGS. 3 to 5D, the display panel PN includes a first substrate 110 supporting components disposed above the display device 100 and includes an insulating substrate. In addition, a plurality of pixels PX are disposed on the first substrate 110 and are used to display images. Also, the first substrate 110 may be formed of glass, resin, or the like. Further, the first substrate 110 may include polymer or plastic and can be formed of a plastic material having flexibility.

Referring to FIG. 3, a plurality of pixel areas UPA, gate driving areas GA, and pad areas are disposed in the first substrate 110. Also, the pixel areas UPA and gate driving areas GA can be included in the active area AA of the display panel PN.

First, the pixel areas UPA include the plurality of pixels PX. As shown, the pixel areas UPA can be disposed in rows and columns. Also, each pixel PX disposed in the pixel areas UPA includes a plurality of sub pixels SP. Each sub pixel SP includes a light emitting diode 130 and a pixel circuit to independently emit light.

Further, the gate driving areas GA include the gate drivers GD. In more detail, the gate driver GD can be mounted in the active area AA in a gate in active area (GIA) manner. For example, the gate driving area GA can be disposed along a row direction and/or column direction between the pixel areas UPA. The gate driver GD disposed in the gate driving area GA can also supply the scan signal to the plurality of scan lines SL.

Further, the gate driver GD disposed in the gate driving area GA can include a circuit for outputting a scan signal. Also, the gate driver GD can include, for example, a plurality of transistors and/or capacitors. Here, active layers of the transistors can be formed of a semiconductor material, such as an oxide semiconductor, amorphous silicon, or polysilicon, but are not limited thereto. The active layers of the transistors can also be formed of the same material or different materials from each other. Further, the active layers of the transistors of the gate driver can be formed of the same material as active layers of various transistors of the pixel circuit or formed of different materials from each other.

In addition, the pad areas include the first pad electrodes PAD1. In more detail, the first pad electrodes PAD1 can transmit signals to various wiring lines extending in a column direction in the active area AA. For example, the first pad electrodes PAD1 includes a data pad DP, a gate pad GP, a high potential power pad VP1, and a low potential power pad VP2. The data pad DP transmits a data voltage to the data line DL and the gate pad GP transmits a clock signal, a start signal, a gate low voltage, a gate high voltage, and the like for driving the gate driver GD to the gate driver GD. Also, the high potential power pad VP1 transmits a high potential power voltage to the high potential power line VL1 and the low potential power pad VP2 transmits a low potential power voltage to the low potential power line VL2.

Further, the pad areas includes a first pad area PA1 located at an upper edge of the display panel PN and a second pad area PA2 of the display panel PN. Also, in the first pad area PA1 and the second pad area PA2, different types of first pad electrodes PAD1 can be disposed. For example, as shown in FIG. 3, the data pad DP, the gate pad GP, and the high potential power pad VP1 can be disposed in the first pad area PA1, and the low potential power pad VP2 can be disposed in the second pad area PA2.

In addition, the first pad electrodes PAD1 can have different sizes. For example, the data pads DP connected to the data lines DL one to one can have a narrower width and the high potential power pad VP1, the low potential power pad VP2, and the gate pad GP can have a larger width. In addition, the widths of the data pad DP, the gate pad GP, the high potential power pad VP1, and the low potential power pad VP2 illustrated in FIG. 3 are examples and the first pad electrode PAD1 can be configured in various sizes.

In addition, to reduce the bezel of the display panel PN, an edge of the display panel PN can be cut and removed. In more detail, the pixels PX, the wiring lines, and the first pad electrodes PAD1 are disposed on an initial first substrate 110*i* and an edge part of the initial first substrate 110*i* is ground to reduce the bezel area. During the grinding process, a part of the initial first substrate 110*i* is removed leaving a first substrate 110 with a smaller size. Also, parts of the first pad electrodes PAD1 and wiring lines disposed at the edge of the first substrate 110 can be removed. Accordingly, only some of the first pad electrodes PAD1 can remain on the first substrate 110.

Next, the data lines DL extending in a column direction from the first pad electrodes PAD1 are disposed on the first substrate 110 of the display panel PN. In particular, the data lines DL can extend from the data pads DP of the first pad area PA1 toward the pixel areas UPA. Further, the data lines DL can extend in a column direction and overlap the pixel areas UPA. Therefore, the data lines DL can transmit the data voltage to the pixel circuit of each sub pixel SP.

In addition, the high potential power lines VL1 extending in the column direction are disposed on the first substrate 110 of the display panel PN. Some of the high potential power lines VL1 extend from the high potential power pad VP1 of the first pad area PA1 to the pixel areas UPA to transmit the high potential power voltage to the light emitting diode 130 of each sub pixel SP. The others of the plurality of high potential power lines VL1 can be electrically connected to the other high potential power line VL1 by an auxiliary high potential power line AVL1 to be described below. FIG. 3 illustrates one high potential power line VL1 and one high potential power pad VP1 but a plurality of high potential power lines VL1 and high potential power pads VP1 can be disposed.

In addition, the low potential power lines VL2 extending in the column direction are disposed on the first substrate 110 of the display panel PN. At least some of the low potential power lines VL2 extend from the low potential power pad VP2 of the second pad area PA2 to the pixel areas UPA to transmit the low potential power voltage to the pixel circuit of each of the sub pixels SP. The others of the low potential power lines VL2 can be electrically connected to the other low potential power line VL2 by an auxiliary low potential power line AVL2 to be described below.

Further, the scan lines SL extending in the row direction are disposed on the first substrate 110 of the display panel PN. The scan lines SL extend in the row direction and can be disposed across the pixel areas UPA and the gate driving areas GA. The scan lines SL can transmit the scan signal from the gate driver GD to the pixel circuits of the sub pixels SP.

Further, auxiliary high potential power lines AVL1 extending in the row direction are disposed on the first substrate 110 of the display panel PN. The auxiliary high potential power lines AVL1 can be disposed in an area between the pixel areas UPA. The auxiliary high potential power lines AVL1 extending in the row direction are electrically connected to the high potential power lines VL1 extending in the column direction through a contact hole and can form a mesh structure. Therefore, the auxiliary high potential power lines AVL1 and the high potential power lines VL1 are configured to form a mesh structure to minimize a voltage drop and voltage deviation.

In addition, as shown in FIG. 3, the auxiliary low potential power lines AVL2 extending in the row direction are disposed on the first substrate 110 of the display panel PN. The auxiliary low potential power lines AVL2 can be disposed in an area between the pixel areas UPA. Further, the auxiliary low potential power lines AVL2 extending in the row direction are electrically connected to the low potential power lines VL2 extending in the column direction through a contact hole to form a mesh structure. Therefore, the auxiliary low potential power lines AVL2 and the low potential power lines VL2 are configured to form a mesh structure to reduce a resistance of the wiring line and minimize voltage deviation.

Referring to FIGS. 3 and 4A, the gate driving lines GVL extending in the row direction and the column direction are disposed on the first substrate 110 of the display panel PN. Some of the gate driving lines GVL extend from the gate pad GP of the first pad area PA1 to the gate driving area GA to transmit a signal to the gate driver GD. The others of the gate driving lines GVL extend in the row direction and can transmit the signal to the gate drivers GD of the gate driving areas GA. Therefore, various signals are transmitted from the gate driving line GVL to the gate driver GD to drive the gate driver GD.

Further, the gate driving lines GVL can include wiring lines which transmit a clock signal, a start signal, a gate high voltage, a gate low voltage, and the like to the gate driver GD. Therefore, various signals are transmitted from the gate driving line GVL to the gate driver GD to drive the gate driver GD.

For example, referring to FIG. 4A, the gate driving lines GVL can include a gate power line which transmits a power voltage to the gate driver GD of the gate driving area GA. The gate power lines include a first gate power line VGHL which transmits a gate high voltage to the gate driver GD, and a second gate power line VGLL which transmits a gate low voltage to the gate driver GD.

In addition, alignment keys AK1 and AK2 are disposed in an area between the pixel areas UPA in the display panel PN. In particular, the alignment keys AK1 and AK2 are used for alignment during the manufacturing process of the display panel PN. The alignment keys AK1 and AK2 include, for example, a first alignment key AK1 and a second alignment key AK2.

In more detail, the first alignment key AK1 can be disposed in the gate driving area GA between the pixel areas UPA. The first alignment key AK1 can be used to inspect an alignment position of the light emitting diodes 130. Also, the first alignment key AK1 can have a cross shape, but other shapes are possible.

In addition, the second alignment key AK2 can be disposed to overlap the high potential power line VL1 between the pixel areas UPA. That is, a hole overlapping the second alignment key AK2 is formed in the high potential power line VL1 to divide the second alignment key AK2 and the high potential power line VL1. The second alignment key AK2 can the donor are aligned using the second alignment key AK2 and the light emitting diodes also be used to align the display panel PN and a donor. In particular, the display panel PN and 130 of the donor can be transferred onto the display panel PN. Also, the second alignment key AK2 can have a circular ring shape, but other shapes are possible.

Hereinafter, the sub pixels SP of the pixel area UPA will be described in more detail with reference to FIGS. 4A to 5D. Referring to FIGS. 4A and 4B, a plurality of sub pixels SP forming one pixel PX are disposed in one pixel area UPA. For example, the sub pixels SP can include a first sub pixel SP1, a second sub pixel SP2, a third sub pixel SP3, and a fourth sub pixel SP4 which emit different color light. In addition, red light emitting diodes 130R can be disposed in the first sub pixel SP1 and the second sub pixel SP2, a green light emitting diode 130G can be disposed in the third sub pixel SP3, and a blue light emitting diode 130B can be disposed in the fourth sub pixel SP4. Further, the first sub pixel SP1 and the second sub pixel SP2 which emit the same color light can include the red light emitting diodes 130R and the pixel circuits, respectively, to independently emit light, but are not limited thereto.

Referring to FIG. 4A, as described above, a plurality of wiring lines supplying various signals to the sub pixels SP are disposed in the pixel areas UPA of the first substrate 110. For example, the data lines DL, the high potential power lines VL1, and the low potential power lines VL2 extending in the column direction can be disposed on the first substrate 110. Also, the emission control signal lines EL, the auxiliary high potential power lines AVL1, the auxiliary low potential power lines AVL2, the first scan lines SL1, and the second scan lines SL2 extending in the row direction can be disposed on the first substrate 110. Further, the high potential power line VL1 extending in the column direction can be electrically connected to the auxiliary high potential power line AVL1 extending in the row direction through a contact hole. In addition, the emission control signal line EL transmits an emission control signal EL to the pixel circuits of the sub pixels SP to a control emission timing of each of the sub pixels SP.

Some gate driving lines GVL which transmit signals to the gate drivers GD spaced apart from each other with the pixel area UPA therebetween can be disposed across the pixel area UPA while extending to the row direction. For example, a first gate power line VGHL for supplying a gate high voltage to the gate driver GD and a second gate power line VGLL for supplying a gate low voltage can be disposed across the pixel area UPA. In addition, the configuration of the scan lines can vary depending on the pixel circuit configuration of the sub pixel SP.

Further, the pixel circuit for driving the light emitting diode 130 is disposed in each sub pixel SP on the first substrate 110. The pixel circuit can include thin film transistors and capacitors. In more detail, FIGS. 4A and 5A to 5D illustrate a driving transistor DT, a first capacitor C1, and a second capacitor C2, among configurations of the pixel circuit. However, the pixel circuit can further include a switching transistor, a sensing transistor, an emission control transistor, and the like.

First, referring to FIGS. 5A to 5D, a light shielding layer BSM is disposed on the first substrate 110 and blocks light incident to an active layer ACT of the transistors to minimize a leakage current. For example, the light shielding layer BSM is disposed below the active layer ACT of the driving transistor DT to block light incident onto the active layer ACT. If light is irradiated onto the active layer ACT, a leakage current is generated, which deteriorates the reliability of the transistor. Accordingly, the light shielding layer BSM which blocks the light is disposed on the first substrate 110 to improve the reliability of the driving transistor DT. The light shielding layer BSM can be configured by an opaque conductive material such as copper (Cu), aluminum (Al), molybdenum (Mo), nickel (Ni), titanium (Ti), chrome (Cr), or an alloy thereof, but is not limited thereto.

In addition, a buffer layer 111 is disposed on the light shielding layer BSM. In particular, the buffer layer 111 can reduce permeation of moisture or impurities through the first substrate 110. The buffer layer 111 can also be configured by a single layer or a double layer of silicon oxide SiOx or silicon nitride SiNx. However, the buffer layer 111 can also be omitted depending on a type of the first substrate 110 or a type of the thin film transistor, but is not limited thereto.

Further, an additional buffer layer can be disposed between the first substrate 110 and the light shielding layer BSM and be configured by a single layer or a double layer of silicon oxide SiOx or silicon nitride SiNx to reduce permeation of moisture or impurities through the first substrate 110, like the buffer layer 111.

Further, as shown, a driving transistor DT including an active layer ACT, a gate electrode GE, a source electrode SE, and a drain electrode DE is disposed on the buffer layer 111. First, the active layer ACT of the driving transistor DT is disposed on the buffer layer 111. In addition, the active layer ACT can be formed of a semiconductor material such as an oxide semiconductor, amorphous silicon, or polysilicon, etc.

Further, other transistors, such as a switching transistor, a sensing transistor, an emission control transistor, and the like, other than the driving transistor DT, can be further disposed. The active layers of the transistors can be also formed of a semiconductor material, such as an oxide semiconductor, amorphous silicon, or polysilicon, for example. Further, the active layer of the transistor included in the pixel circuit, such as the driving transistor DT, the switching transistor, the sensing transistor, the emission control transistor, and the like can be formed of the same material, or formed of different materials.

In addition, as shown, a gate insulating layer 112 is disposed on the active layer ACT, electrically insulates the active layer ACT from the gate electrode GE, and can be configured by a single layer or a double layer of silicon oxide SiOx or silicon nitride SiNx. Further, the gate electrode GE is disposed on the gate insulating layer 112 and can be configured by a conductive material, such as copper (Cu), aluminum (Al), molybdenum (Mo), nickel (Ni), titanium (Ti), chrome (Cr), or an alloy thereof.

In addition, a first interlayer insulating layer 113 and a second interlayer insulating layer 114 are disposed on the gate electrode GE. Also, contact holes through which the source electrode SE and the drain electrode DE are connected to the active layer ACT are formed in the first and second interlayer insulating layers 113 and 114. In addition, the first interlayer insulating layer 113 and the second interlayer insulating layer 114 protect components therebelow and can be configured by single layers or double layers of silicon oxide SiOx or silicon nitride SiNx.

In addition, the source electrode SE and the drain electrode DE electrically connected to the active layer ACT are disposed on the second interlayer insulating layer 114. Also, the source electrode SE is connected to the second capacitor C2 and the first electrode 134 of the light emitting diode 130 and the drain electrode DE is connected to the other configuration of the pixel circuit. The source electrode SE and the drain electrode DE can also be configured by a conductive material, such as copper (Cu), aluminum (Al), molybdenum (Mo), nickel (Ni), titanium (Ti), chrome (Cr), or an alloy thereof, etc.

Next, the first capacitor C1 is disposed on the gate insulating layer 112. As shown, the first capacitor C1 includes a 1-1-th capacitor electrode C1*a* and a 1-2-th capacitor electrode C1*b*. First, the 1-1-th capacitor electrode C1*a* is disposed on the gate insulating layer 112 and can be integrally disposed with the gate electrode GE of the driving transistor DT.

Further, the 1-2-th capacitor electrode C1*b* is disposed on the first interlayer insulating layer 113 and is disposed to overlap the 1-1-th capacitor electrode C1*a* with the first interlayer insulating layer 113 therebetween. Therefore, the first capacitor C1 is connected to the gate electrode GE of the driving transistor DT to maintain a voltage of the gate electrode GE of the driving transistor DT for a predetermined period.

Next, the second capacitor C2 is disposed on the first substrate 110 and includes a 2-1-th capacitor electrode C2*a*, a 2-2-th capacitor electrode C2*b*, and a 2-3-th capacitor electrode C2*c*. The second capacitor C2 includes the 2-1-th capacitor electrode C2*a* which is a lower capacitor electrode, the 2-2-th capacitor electrode C2*b* which is an intermediate capacitor electrode, and the 2-3-th capacitor electrode C2*c* which is an upper capacitor electrode.

Further, the 2-1-th capacitor electrode C2*a* is disposed on the first substrate 110, is disposed on the same layer as the light shielding layer BSM and can be formed of the same material. Also, the 2-2-th capacitor electrode C2*b* is disposed on the buffer layer 111 and the gate insulating layer 112. In particular, the 2-2-th capacitor electrode C2*b* is disposed on the same layer as the gate electrode GE and can be formed of the same material.

Further, the 2-3-th capacitor electrode C2*c* is disposed on the first interlayer insulating layer 113 and can be configured by a first layer C2*c*1 and a second layer C2*c*2. The first layer C2*c*1 of the 2-3-th capacitor electrode C2*c* can be disposed on the same layer as the 1-2-th capacitor electrode C1*b* with the same material. Also, the first layer C2*c*1 can be disposed to overlap the 2-1-th capacitor electrode C2*a* and the 2-2-th capacitor electrode C2*b* with the first interlayer insulating layer 113 therebetween.

In addition, the second layer C2*c*2 of the 2-3-th capacitor electrode C2*c* is disposed on the second interlayer insulating layer 114. In particular, the second layer C2*c*2 is a part extending from the source electrode SE of the driving transistor DT and can be connected to the first layer C2*c*1 through the contact hole of the second interlayer insulating layer 114.

Accordingly, the second capacitor C2 is electrically connected between the source electrode SE of the driving transistor DT and the light emitting diode 130 to increase capacitance inherent in the light emitting diode 130 and allow the light emitting diode 130 to emit light with a higher luminance.

In addition, a first passivation layer 115*a* is disposed on the driving transistor DT, the first capacitor C1, and the second capacitor C2. In particular, the first passivation layer 115*a* protects components below the first passivation layer 115*a* and can be configured by an inorganic material, such as silicon oxide SiOx or silicon nitride SiNx, for example.

Further, a first planarization layer 116*a* is disposed on the first passivation layer 115*a* and planarizes an upper portion of the pixel circuit including the driving transistor DT. The first planarization layer 116*a* can also be configured by a single layer or a double layer, and for example, configured by benzocyclobutene or an acrylic organic material.

Figure 5A:
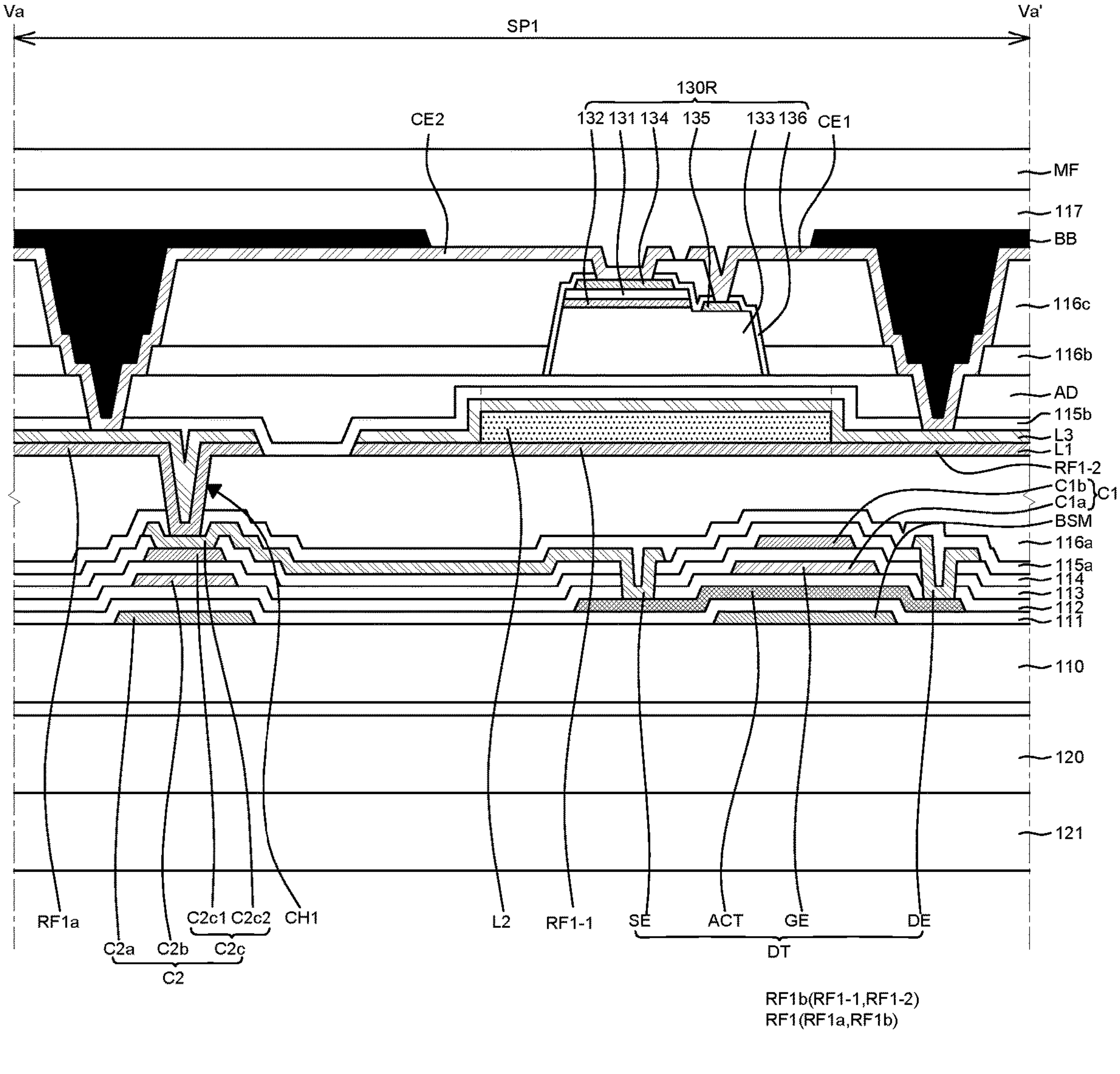
FIGS. 5A to 5D are cross-sectional views of a display device according to an exemplary embodiment of the present disclosure.
Figure 5B:
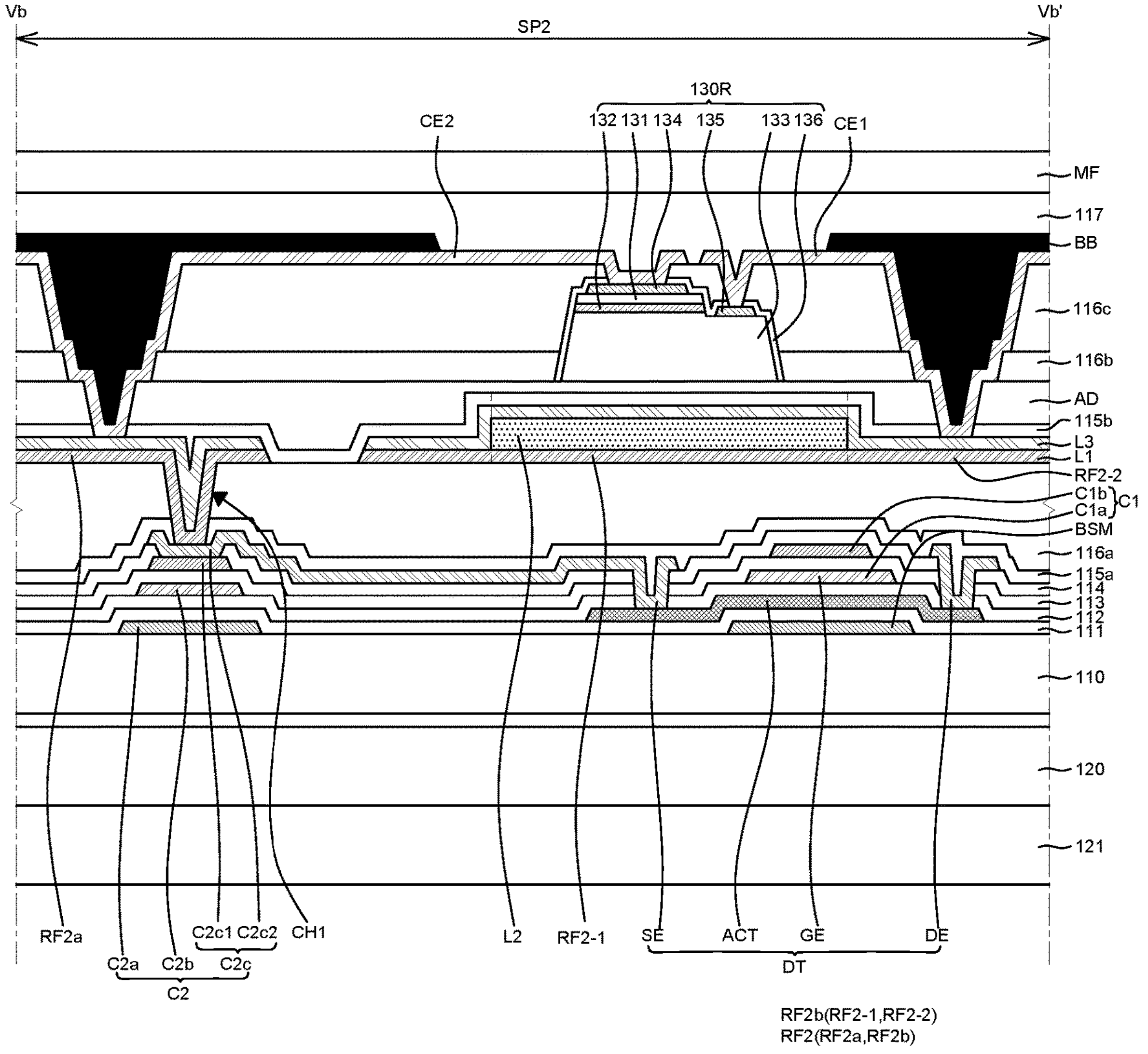
Figure 5C:
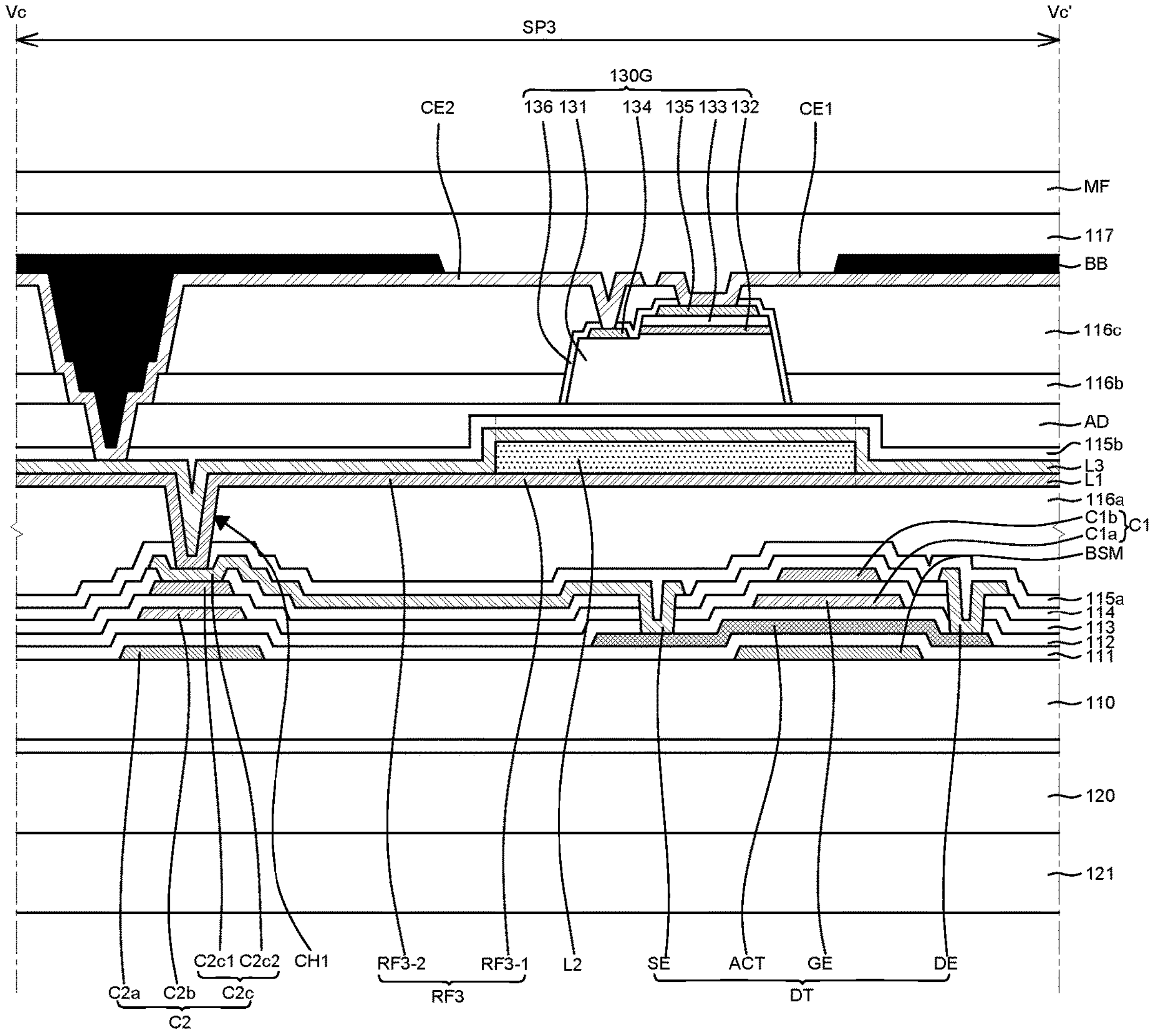
Figure 5D:
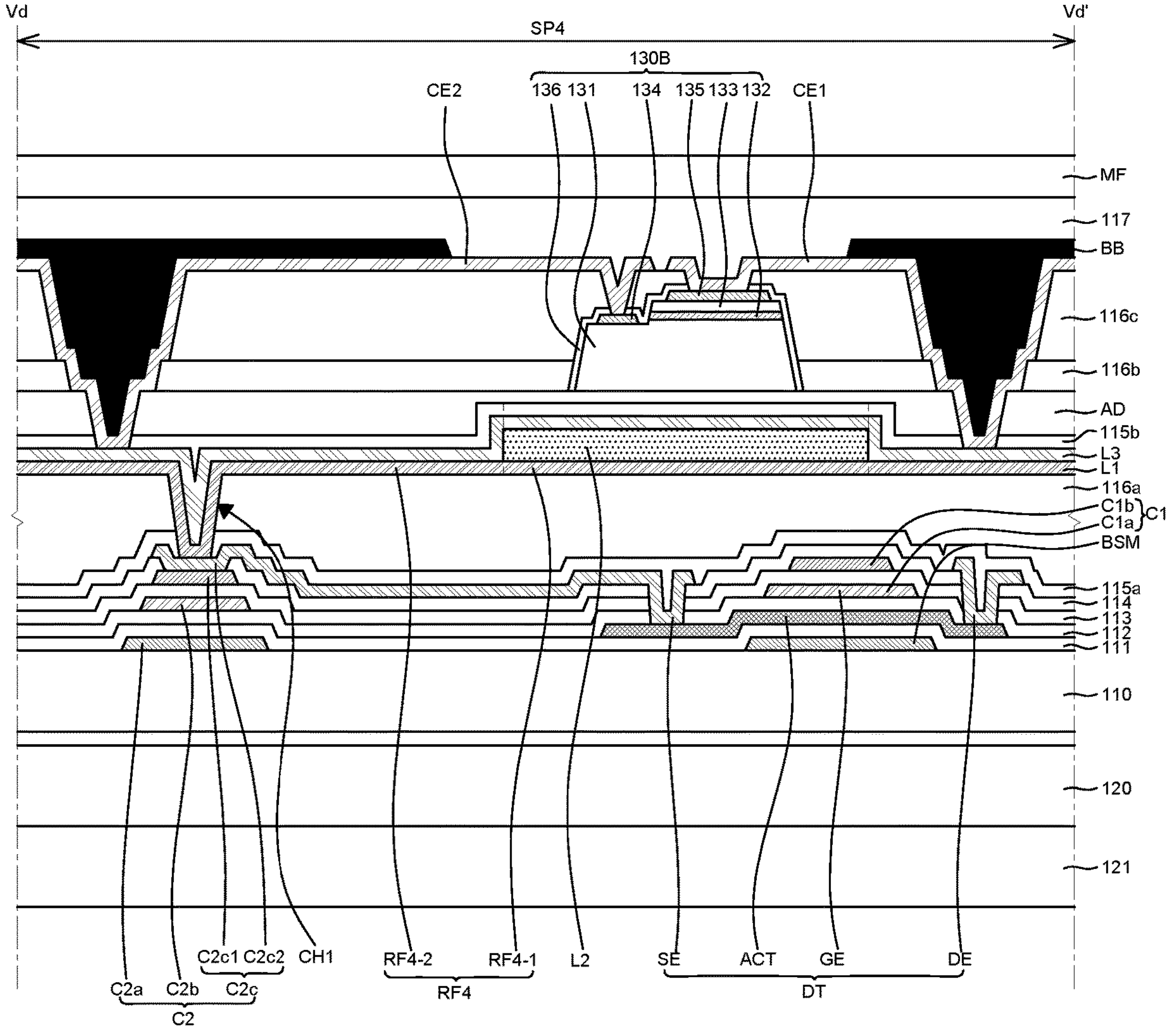

Referring to FIGS. 4B and 5A to 5D, reflection plates are disposed on the first planarization layer 116*a*. In more detail, the reflection plates reflect light emitted from the light emitting diodes 130 above the first substrate 110 and can be formed with a shape corresponding to each of the sub pixels SP. In addition, a reflection plate can be disposed to cover most of the area of one sub pixel SP. Thus, the reflection plate reflects the light emitted from the light emitting diode 130 and can be also used as an electrode which electrically connects the light emitting diode 130 and the pixel circuit. In more detail, the reflection plate includes a first reflection plate RF1 corresponding to the first sub pixel SP1 (FIG. 5A), a second reflection plate RF2 corresponding to the second sub pixel SP2 (FIG. 5B), a third reflection plate RF3 corresponding to the third sub pixel SP3 (FIG. 5C), and a fourth reflection plate RF4 corresponding to the fourth sub pixel SP4 (FIG. 5D).

Referring to FIGS. 4B and 5A, the first reflection plate RF1 includes a 1-1-th reflection plate RF1*a* overlapping most of or a large portion of the first sub pixel SP1 (see FIG. 4B) and a 1-2-th reflection plate RF1*b* overlapping the red light emitting diode 130R of the first sub pixel SP1. Further, the 1-1-th reflection plate RF1*a* reflects light emitted from the red light emitting diode 130R above the red light emitting diode 130R. In addition, the 1-1-th reflection plate RF1*a* can be electrically connected to the source electrode SE of the driving transistor DT and the second capacitor C2 through a first contact hole CH1 of the first planarization layer 116*a* and the first passivation layer 115*a*. Therefore, the 1-1-th reflection plate RF1*a* can electrically connect the driving transistor DT and the first electrode 134 of the red light emitting diode 130R.

In addition, the 1-2-th reflection plate RF1*b* can reflect light emitted from the red light emitting diode 130R above the red light emitting diode 130R. The 1-2-th reflection plate RF1*b* can serve as an electrode which electrically connects the second electrode 135 of the red light emitting diode 130R and the high potential power line VL1. Therefore, voltages applied to the second electrode 135 contacting the second semiconductor layer 133 of the red light emitting diode 130R and the 1-2-th reflection plate RF1*b* disposed below the red light emitting diode 130R are the same high potential power voltage. Accordingly, a vertical electric field is not generated between the 1-2-th reflection plate RF1*b* and the red light emitting diode 130R and the reliability problem caused by the vertical electric field can be suppressed.

In addition, the 1-2-th reflection plate RF1*b* can include a first part RF1-1 and a second part RF1-2. Also, the 1-2-th reflection plate RF1*b* can include the first part RF1-1 overlapping the red light emitting diode 130R and the second part RF1-2 extending from the first part RF1-1.

Further, the first part RF1-1 of the 1-2-th reflection plate RF1*b* reflects light emitted from the red light emitting diode 130R, and the second part RF1-2 of the 1-2-th reflection plate RF1*b* can be used as an electrode which electrically connects the red light emitting diode 130R and the pixel circuit. Therefore, the reflectance of the first part RF1-1 of the 1-2-th reflection plate RF1*b* can be higher than the reflectance of the second part RF1-2 of the 1-2-th reflection plate RF1*b*.

Referring to FIG. 5A, the first part RF1-1 of the 1-2-th reflection plate RF1*b* can include a plurality of layers. For example, the first part RF1-1 of the 1-2-th reflection plate RF1*b* can include a first layer L1, a second layer L2 disposed on the first layer L1, and a third layer L3 disposed on the second layer L2. Further, the first layer L1 and the third layer L3 can be disposed so as to enclose a top surface, a side surface, and a bottom surface of the second layer L2.

Also, the first layer L1 and the second layer L2 can be formed of a metal material and the third layer L3 can be formed of a transparent conductive oxide. Further, the second layer L2 can be formed of a material having a reflectance higher than those of the first layer L1 and the third layer L3. For example, the first layer L1 can be formed of titanium (Ti), the second layer L2 can be formed of aluminum (Al), and the third layer L3 can be formed of indium tin oxide (ITO).

In addition, the second part RF1-2 of the 1-2-th reflection plate RF1*b* can include some of the plurality of layers. For example, the second part RF1-2 of the 1-2-th reflection plate RF1*b* can include the first layer L1 and the third layer L3. Therefore, the second part RF1-2 can be configured by a layer formed of titanium (Ti) and a layer formed of indium tin oxide (ITO), for example.

Further, the 1-1-th reflection plate RF1*a* can include some of the plurality of layers. For example, the 1-1-th reflection plate RF1*a* can include the first layer L1 and the third layer L3. Therefore, the 1-1-th reflection plate RF1*a* can be configured by a layer formed of titanium (Ti) and a layer formed of indium tin oxide (ITO), for example.

Referring to FIGS. 4B and 5B, the second reflection plate RF2 includes a 2-1-th reflection plate RF2*a* overlapping most of or a large portion of the second sub pixel SP2 (see FIG. 4B) and a 2-2-th reflection plate RF2*b* overlapping the red light emitting diode 130R of the second sub pixel SP2.

Further, the 2-1-th reflection plate RF2*a* can reflect light emitted from the red light emitting diode 130R above the red light emitting diode 130R. The 2-1-th reflection plate RF2*a* can also be electrically connected to the source electrode SE of the driving transistor DT and the second capacitor C2 through a first contact hole CH1 of the first planarization layer 116*a* and the first passivation layer 115*a*. Therefore, the 2-1-th reflection plate RF2*a* can electrically connect the driving transistor DT and the first electrode 134 of the red light emitting diode 130R.

In addition, the 2-2-th reflection plate RF2*b* can reflect light emitted from the red light emitting diode 130R above the red light emitting diode 130R. The 2-2-th reflection plate RF2*b* can also serve as an electrode which electrically connects the second electrode 135 of the red light emitting diode 130R and the high potential power line VL1. Therefore, voltages applied to the second electrode 135 which is in contact with the second semiconductor layer 133 of the red light emitting diode 130R and the 2-2-th reflection plate RF2*b* disposed below the red light emitting diode 130R are the same high potential power voltage. Accordingly, a vertical electric field is not generated between the 2-2-th reflection plate RF2*b* and the red light emitting diode 130R and the reliability problem caused by the vertical electric field can be suppressed.

In addition, the 2-2-th reflection plate RF2*b* can include a first part RF2-1 and a second part RF2-2. The 2-2-th reflection plate RF2*b* can also include the first part RF2-1 overlapping the red light emitting diode 130R and the second part RF2-2 extending from the first part RF2-1.

Further, the first part RF2-1 of the 2-2-th reflection plate RF2*b* can reflect light emitted from the red light emitting diode 130R and the second part RF2-2 of the 2-2-th reflection plate RF2*b* can be used as an electrode which electrically connects the red light emitting diode 130R and the pixel circuit. Therefore, the reflectance of the first part RF2-1 of the 2-2-th reflection plate RF2*b* can be higher than the reflectance of the second part RF2-2 of the 2-2-th reflection plate RF2*b*. Referring to FIG. 5B, the first part RF2-1 of the 2-2-th reflection plate RF2*b* can include a plurality of layers. For example, the first part RF2-1 of the 2-2-th reflection plate RF2*b* can include a first layer L1, a second layer L2 disposed on the first layer L1, and a third layer L3 disposed on the second layer L2. Further, the first layer L1 and the third layer L3 can be disposed so as to enclose a top surface, a side surface, and a bottom surface of the second layer L2.

In addition, the first layer L1 and the second layer L2 can be formed of a metal material and the third layer L3 can be formed of a transparent conductive oxide. Further, the second layer L2 can be formed of a material having a reflectance higher than those of the first layer L1 and the third layer L3. For example, the first layer L1 can be formed of titanium (Ti), the second layer L2 can be formed of aluminum (Al), and the third layer L3 can be formed of indium tin oxide (ITO).

The second part RF2-2 of the 2-2-th reflection plate RF2*b* can include some of the plurality of layers. For example, the second part RF2-2 of the 2-2-th reflection plate RF2*b* can include the first layer L1 and the third layer L3 among the layers. Therefore, the second part RF2-2 can be configured by a layer formed of titanium (Ti) and a layer formed of indium tin oxide (ITO), but is not limited thereto.

Further, the 2-1-th reflection plate RF2*a* can include some of the plurality of layers. For example, the 2-1-th reflection plate RF2*a* can include the first layer L1 and the third layer L3. Therefore, the 2-1-th reflection plate RF2*a* can be configured by a layer formed of titanium (Ti) and a layer formed of indium tin oxide (ITO), but is not limited thereto.

Referring to FIGS. 4B and 5C, the third reflection plate RF3 can reflect light emitted from the green light emitting diode 130G above the green light emitting diode 130G.

Further, the third reflection plate RF3 can be electrically connected to the source electrode SE of the driving transistor DT and the second capacitor C2 through a first contact hole CH1 of the first planarization layer 116*a* and the first passivation layer 115*a*. Therefore, the third reflection plate RF3 can electrically connect the driving transistor DT and the first electrode 134 of the green light emitting diode 130G.

Further, the third reflection plate RF3 can include a first part RF3-1 and a second part RF3-2. The third reflection plate RF3 can include the first part RF3-1 overlapping the green light emitting diode 130G and the second part RF3-2 extending from the first part RF3-1.

In addition, the first part RF3-1 of the third reflection plate RF3 can reflect light emitted from the green light emitting diode 130G and the second part RF3-2 of the third reflection plate RF3 can be used as an electrode which electrically connects the green light emitting diode 130G and the pixel circuit. Therefore, the reflectance of the first part RF3-1 of the third reflection plate RF3 can be higher than the reflectance of the second part RF3-2 of the third reflection plate RF3. Further, voltages applied to the first electrode 134 which is in contact with the first semiconductor layer 131 of the green light emitting diode 130G and the third reflection plate RF3 disposed below the green light emitting diode 130G are the same output voltage of the driving transistor DT. Accordingly, a vertical electric field is not generated between the third reflection plate RF3 and the green light emitting diode 130G and the reliability problem caused by the vertical electric field can be suppressed.

Referring to FIG. 5C, the first part RF3-1 of the third reflection plate RF3 can include a plurality of layers. For example, the first part RF3-1 of the third reflection plate RF3 can include a first layer L1, a second layer L2 disposed on the first layer L1, and a third layer L3 disposed on the second layer L2. Further, the first layer L1 and the third layer L3 can be disposed so as to enclose a top surface, a side surface, and a bottom surface of the second layer L2.

Further, the first layer L1 and the second layer L2 can be formed of a metal material and the third layer L3 can be formed of a transparent conductive oxide. Further, the second layer L2 can be formed of a material having a reflectance higher than those of the first layer L1 and the third layer L3. For example, the first layer L1 can be formed of titanium (Ti), the second layer L2 can be formed of aluminum (Al), and the third layer L3 can be formed of indium tin oxide (ITO).

In addition, the second part RF3-2 of the third reflection plate RF3 can include some of the plurality of layers. For example, the second part RF3-2 of the third reflection plate RF3 can include the first layer L1 and the third layer L3. Therefore, the second part RF3-2 can be configured by a layer formed of titanium (Ti) and a layer formed of indium tin oxide (ITO), for example.

Referring to FIGS. 4B and 5D, the fourth reflection plate RF4 can reflect light emitted from the blue light emitting diode 130B above the blue light emitting diode 130B. Further, the fourth reflection plate RF4 can be electrically connected to the source electrode SE of the driving transistor DT and the second capacitor C2 through a first contact hole CH1 of the first planarization layer 116*a* and the first passivation layer 115*a*. Therefore, the fourth reflection plate RF4 can electrically connect the driving transistor DT and the first electrode 134 of the blue light emitting diode 130B.

In addition, the fourth reflection plate RF4 can include a first part RF4-1 and a second part RF4-2. The fourth reflection plate RF4 can include the first part RF4-1 overlapping the blue light emitting diode 130B and the second part RF4-2 extending from the first part RF4-1.

Further, the first part RF4-1 of the fourth reflection plate RF4 can reflect light emitted from the blue light emitting diode 130B and the second part RF4-2 of the fourth reflection plate RF4 can be used as an electrode which electrically connects the blue light emitting diode 130B and the pixel circuit. Therefore, the reflectance of the first part RF4-1 of the fourth reflection plate RF4 can be higher than the reflectance of the second part RF4-2 of the fourth reflection plate RF4. Further, voltages applied to the first electrode 134 which is in contact with the first semiconductor layer 131 of the blue light emitting diode 130B and the fourth reflection plate RF4 disposed below the blue light emitting diode 130B are the same output voltage of the driving transistor DT. Accordingly, a vertical electric field is not generated between the fourth reflection plate RF4 and the blue light emitting diode 130B and the reliability problem caused by the vertical electric field can be suppressed.

Referring to FIG. 5D, the first part RF4-1 of the fourth reflection plate RF4 can include a plurality of layers. For example, the first part RF4-1 of the fourth reflection plate RF4 can include a first layer L1, a second layer L2 disposed on the first layer L1, and a third layer L3 disposed on the second layer L2. Further, the first layer L1 and the third layer L3 can be disposed so as to enclose a top surface, a side surface, and a bottom surface of the second layer L2.

Further, the first layer L1 and the second layer L2 can be formed of a metal material and the third layer L3 can be formed of a transparent conductive oxide. Also, the second layer L2 can be formed of a material having a reflectance higher than those of the first layer L1 and the third layer L3. For example, the first layer L1 can be formed of titanium (Ti), the second layer L2 can be formed of aluminum (Al), and the third layer L3 can be formed of indium tin oxide (ITO).

In addition, the second part RF4-2 of the fourth reflection plate RF4 can include some of the plurality of layers. For example, the second part RF4-2 of the fourth reflection plate RF4 can include the first layer L1 and the third layer L3 among the plurality of layers. Therefore, the second part RF4-2 can be configured by a layer formed of titanium (Ti) and a layer formed of indium tin oxide (ITO), for example.

In addition, even though the description describes the first sub pixel SP1 and the second sub pixel SP2 are disposed with two reflection plates and the third sub pixel SP3 and the fourth sub pixel SP4 are disposed with one reflection plate, the reflection plate can be designed in various manners. For example, only one reflection plate can be disposed in all of the plurality of sub pixels SP, like the third sub pixel SP3 and the fourth sub pixel SP4 or a plurality of reflection plates can be disposed in the sub pixels like the first sub pixel SP1 and the second sub pixel SP2, but the reflection plate is not limited thereto.

Referring to FIGS. 5A to 5D, the second passivation layer 115*b* is disposed on the plurality of reflection plates. In more detail, the second passivation layer 115*b* is an insulating layer which protects components below the second passivation layer 115*b* and can be configured by a single layer or a double layer of silicon oxide SiOx or silicon nitride SiNx, for example.

In addition, an adhesive layer AD is disposed on the second passivation layer 115*b*. As shown, the adhesive layer AD is disposed on the entire surface of the first substrate 110 to fix the light emitting diode 130 disposed on the adhesive layer AD. In more detail, the adhesive layer AD can be formed of a photo curable adhesive material which is cured by light.

For example, the adhesive layer AD can be formed of an acrylic material including a photoresist. The adhesive layer AD can also be disposed on the entire surface of the first substrate 110 excluding a pad area in which the first pad electrode PAD1 is disposed.

Further, the plurality of light emitting diodes 130 are disposed in each of the plurality of sub pixels SP on the adhesive layer AD. In more detail, the light emitting diode 130 emits light by a current and includes a red light emitting diode 130R which emits red light, a green light emitting diode 130G which emits green light, and a blue light emitting diode 130B which emits blue light and can implement light with various colors including white by a combination thereof. For example, the light emitting diode 130 can be an LED or a micro LED.

In addition, the light emitting diode 130 disposed in each sub pixel SP can have a different structure. For example, the light emitting diode 130 can include red light emitting diodes 130R disposed on the first sub pixel SP1 and the second sub pixel SP2, a green light emitting diode 130G disposed on the third sub pixel SP3, and a blue light emitting diode 130B disposed on the fourth sub pixel SP4. Also, one red light emitting diode 130R can be disposed in each of the first sub pixel SP1 and the second sub pixel SP2, one pair of green light emitting diodes 130G can be disposed in the third sub pixel SP3, and one pair of blue light emitting diodes 130B can be disposed in the fourth sub pixel SP4. Further, two red light emitting diodes 130R, two green light emitting diodes 130G, and two blue light emitting diodes 130B can be disposed in one pixel PX. Also, the red light emitting diode 130R can have a structure different from those of the green light emitting diode 130G and two blue light emitting diodes 130B. In addition, each of the red light emitting diodes 130R is connected to the driving transistor DT of each of the first sub pixel SP1 and the second sub pixel SP2 to be individually driven. In contrast, one pair of green light emitting diodes 130G of the third sub pixel SP3 and one pair of blue light emitting diodes 130B of the fourth sub pixel SP4 are connected to one driving transistor DT in parallel to be driven.

First, referring to FIGS. 5A and 5B, the red light emitting diode 130R is disposed in the first sub pixel SP1. As shown, the red light emitting diode 130R includes a first semiconductor layer 131, an emission layer 132, a second semiconductor layer 133, a first electrode 134, a second electrode 135, and an encapsulation layer 136. Further, the second semiconductor layer 133 can be disposed on the adhesive layer AD and the first semiconductor layer 131 can be disposed on the second semiconductor layer 133.

In addition, the emission layer 132 is disposed between the first semiconductor layer 131 and the second semiconductor layer 133. In particular, the emission layer 132 is supplied with holes and electrons from the first semiconductor layer 131 and the second semiconductor layer 133 to emit light. Further, the emission layer 132 can be formed by a single layer or a multi-quantum well (MQW) structure, and for example, can be formed of indium gallium nitride (InGaN), gallium nitride (GaN), or the like, for example. In addition, the second electrode 135 is disposed on the second semiconductor layer 133 in the red light emitting diode 130R and electrically connects the high potential power line VL1 and the second semiconductor layer 133.

Also, the second semiconductor layer 133 is doped with a p-type impurity, such as magnesium, zinc (Zn), and beryllium (Be) and the second electrode 135 can be a cathode. Also, the second electrode 135 can be disposed on a top surface of the second semiconductor layer 133 exposed from the emission layer 132 and the first semiconductor layer 131. Further, the second electrode 135 can be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof.

In addition, the first electrode 134 is disposed on the first semiconductor layer 131 in the red light emitting diode 130R. The first electrode 134 can be disposed on the top surface of the first semiconductor layer 131. Further, the first electrode 134 electrically connects the driving transistor DT and the first semiconductor layer 131. In this instance, the first semiconductor layer 131 is a semiconductor layer doped with an n-type impurity, such as silicon (Si), germanium, or tin (Sn) and the first electrode 134 can be an anode. The first electrode 134 can also be configured by a transparent conductive material, such as indium tin oxide (ITO) or indium zinc oxide (IZO) or an opaque conductive material, such as titanium (Ti), gold (Au), silver (Ag), copper (Cu) or an alloy thereof.

Further, the encapsulation layer 136 encloses or encapsulates the first semiconductor layer 131, the emission layer 132, the second semiconductor layer 133, the first electrode 134, and the second electrode 135. In addition, the encapsulation layer 136 is formed of an insulating material to protect the first semiconductor layer 131, the emission layer 132, and the second semiconductor layer 133. As shown, a contact hole exposing the first electrode 134 and the second electrode 135 is disposed in the encapsulation layer 136 to electrically connect a first connection electrode CE1 and a second connection electrode CE2 to the first electrode 134 and the second electrode 135.

Next, referring to FIG. 5C, the green light emitting diode 130G is disposed in the third sub pixel SP3. In particular, the green light emitting diode 130G includes a first semiconductor layer 131, an emission layer 132, a second semiconductor layer 133, a first electrode 134, and a second electrode 135.

Further, the green light emitting diode 130G can have a structure different from that of the red light emitting diode 130R. For example, in the green light emitting diode 130G, the first semiconductor layer 131 can be disposed on the adhesive layer AD and the second semiconductor layer 133 can be disposed on the first semiconductor layer 131.

Further, the first semiconductor layer 131 and the second semiconductor layer 133 can be layers formed by doping n-type and p-type impurities into a specific material. For example, the first semiconductor layer 131 and the second semiconductor layer 133 can be layers doped with n-type and p-type impurities into a material such as gallium nitride (GaN), indium aluminum phosphide (InAlP), or gallium arsenide (GaAs). The p-type impurity can be magnesium (Mg), zinc (Zn), beryllium (Be), and the like, and the n-type impurity can be silicon (Si), germanium, tin (Sn), and the like.

In addition, the emission layer 132 is disposed between the first semiconductor layer 131 and the second semiconductor layer 133 in the green light emitting diode 130G. In particular, the emission layer 132 is supplied with holes and electrons from the first semiconductor layer 131 and the second semiconductor layer 133 to emit light. Also, the emission layer 132 can be formed by a single layer or a multi-quantum well (MQW) structure, and for example, can be formed of indium gallium nitride (InGaN), gallium nitride (GaN), or the like, for example.

In addition, the first electrode 134 is disposed on the first semiconductor layer 131 in the green light emitting diode 130G. In more detail, the first electrode 134 electrically connects the driving transistor DT and the first semiconductor layer 131. In the green light emitting diode 130G, the first semiconductor layer 131 is doped with an n-type impurity and the first electrode 134 can be a cathode. The first electrode 134 can be disposed on a top surface of the first semiconductor layer 131 which is exposed from the emission layer 132 and the second semiconductor layer 133. The first electrode 134 can be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof, for example.

In addition, the second electrode 135 is disposed on the second semiconductor layer 133 in the green light emitting diode 130G. The second electrode 135 can be disposed on the top surface of the second semiconductor layer 133. Further, the second electrode 135 electrically connects the high potential power line VL1 and the second semiconductor layer 133. In this instance, the second semiconductor layer 133 is a semiconductor layer doped with a p-type impurity and the second electrode 135 can be an anode. The second electrode 135 can be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof.

Next, the encapsulation layer 136 which encloses the first semiconductor layer 131, the emission layer 132, the second semiconductor layer 133, the first electrode 134, and the second electrode 135 is disposed in the green light emitting diode 130G. The encapsulation layer 136 is formed of an insulating material to protect the first semiconductor layer 131, the emission layer 132, and the second semiconductor layer 133. In addition, a contact hole exposing the first electrode 134 and the second electrode 135 is disposed in the encapsulation layer 136 to electrically connect a first connection electrode CE1 and a second connection electrode CE2 to the first electrode 134 and the second electrode 135.

Next, referring to FIG. 5D, the blue light emitting diode 130B is disposed in the fourth sub pixel SP4. The blue light emitting diode 130B includes a first semiconductor layer 131, an emission layer 132, a second semiconductor layer 133, a first electrode 134, and a second electrode 135.

In addition, the blue light emitting diode 130B can have a structure different from that of the red light emitting diode 130R. For example, the blue light emitting diode 130B can have the same structure as the green light emitting diode 130G disposed in the third sub pixel SP3.

In addition, referring to FIGS. 5A to 5D, a part of the side surface of the first semiconductor layer 131 can be exposed from the encapsulation layer 136. Further, the light emitting diode 130 manufactured on the wafer is separated from the wafer to be transferred onto the display panel PN. However, during the process of separating the light emitting diode 130 from the wafer, a part of the encapsulation layer 136 can be torn. For example, a part of the encapsulation layer 136 which is adjacent to a lower edge of the first semiconductor layer 131 of the light emitting diode 130 is torn during the process of separating the light emitting diode 130 from the wafer. Accordingly, a part of a lower side surface of the first semiconductor layer 131 can be exposed to the outside. However, even though the lower portion of the light emitting diode 130 is exposed from the encapsulation layer 136, the first connection electrode CE1 and the second connection electrode CE2 are formed after forming the second planarization layer 116*b* and the third planarization layer 116*c* which cover the side surface of the first semiconductor layer 131. Accordingly, a short problem can be reduced.

Next, referring to FIGS. 5A to 5D, the second planarization layer 116*b* and the third planarization layer 116*c* are disposed on the adhesive layer AD and the light emitting diode 130. As shown, the second planarization layer 116*b* overlaps a part of side surfaces of the light emitting diodes 130 to fix and protect the light emitting diodes 130. The second planarization layer 116*b* can also be formed using a halftone mask. Therefore, the second planarization layer 116*b* can be formed to have a step.

Specifically, a part of the second planarization layer 116*b* which is relatively adjacent to the light emitting diode 130 can have a smaller thickness and a part which is farther from the light emitting diode 130 can have a larger thickness. Also, a part of the second planarization layer 116*b* which is adjacent to the light emitting diode 130 can be disposed to enclose the light emitting diode 130 and also can be in contact with a side surface of the light emitting diode 130. Therefore, a torn part of the encapsulation layer 136 which protects a side surface of the first semiconductor layer 131 of the light emitting diode 130 during the process of separating the light emitting diode 130 from the wafer to be transferred onto the display panel PN can be covered by the second planarization layer 116*b*. By doing this, thereafter, contacts and short problems of the connection electrodes CE1 and CE2 and the first semiconductor layer 131 can be suppressed.

In addition, the third planarization layer 116*c* is disposed to cover upper portions of the second planarization layer 116*b* and the light emitting diode 130 and a contact hole which exposes the first electrode 134 and the second electrode 135 of the light emitting diode 130 can be formed. The first electrode 134 and the second electrode 135 of the light emitting diode 130 are exposed from the third planarization layer 116*c* and the third planarization layer 116*c* is partially disposed in an area between the first electrode 134 and the second electrode 135 to reduce a short problem. Further, the second planarization layer 116*b* and the third planarization layer 116*c* can be configured by a single layer or a double layer, and for example, can be formed of photoresist or an acrylic organic material, but is not limited thereto.

In addition, the third planarization layer 116*c* can cover only the light emitting diode 130 and an area adjacent to the light emitting diode 130. The third planarization layer 116*c* is disposed in an area of the sub pixel SP enclosed by the bank BB and can be disposed in an island shape. Therefore, the bank BB is disposed in a part of the top surface of the second planarization layer 116*b* and the third planarization layer 116*c* can be disposed in the other part of the top surface of the second planarization layer 116*b*.

In addition, the first connection electrode CE1 and the second connection electrode CE2 are disposed on the third planarization layer 116*c*. Also, the first connection electrode CE1 electrically connects the second electrode 135 of the light emitting diode 130 and the high potential power line VL1. The first connection electrode CE1 can be electrically connected to the second electrode 135 of the light emitting diode 130 through a contact hole disposed in the third planarization layer 116*c*.

In addition, the second connection electrode CE2 electrically connects the first electrode 134 of the light emitting diode 130 and the driving transistor DT. The second connection electrode CE2 can be connected to the 1-1-th reflection plate RF1*a*, the 2-1-th reflection plate RF2*a*, the third reflection plate RF3, and the fourth reflection plate RF4 of each of the sub pixels SP exposed through contact holes disposed in the third planarization layer 116*c*, the second planarization layer 116*b*, the adhesive layer AD, and the second passivation layer 115*b*. Further, the contact hole can be disposed in an area overlapping the second part RF1-2 of the 1-2-th reflection plate RF1*b*, the 1-1-th reflection plate RF1*a*, the second part RF2-2 of the 2-2-th reflection plate RF2*b*, the 2-1-th reflection plate RF2*a*, the second part RF3-2 of the third reflection plate RF3, and the second part RF4-2 of the fourth reflection plate RF4 of the reflection plates.

In addition, the 1-1-th reflection plate RF1*a*, the 2-1-th reflection plate RF2*a*, the third reflection plate RF3, and the fourth reflection plate RF4 are also connected to the source electrode SE of the driving transistor DT. Therefore, the source electrode SE of the driving transistor DT and the first electrode 134 of the light emitting diode 130 can be electrically connected to each other.

In addition, FIGS. 5A-5D illustrate the first electrode 134, the second connection electrode CE2, and the reflection plate are electrically connected to the source electrode SE of the driving transistor DT. However, the first electrode 134, the second connection electrode CE2, and the reflection plate can be connected to the drain electrode DE of the driving transistor DT, for example.

In addition, a bank BB is disposed on the second planarization layer 116*b* exposed from the first connection electrode CE1 and the second connection electrode CE2, and the third planarization layer 116*c*. The bank BB can be disposed to be spaced apart from the light emitting diode 130 with a predetermined interval and can overlap at least partially the reflection plate RF. For example, the bank BB can cover a part of the second connection electrode CE2 disposed in the contact holes of the third planarization layer 116*c* and the second planarization layer 116*b*. Further, for example, the bank BB can be disposed on the second planarization layer 116*b* with a predetermined interval from the light emitting diode 130. In this instance, the bank BB and the third planarization layer 116*c* can be spaced apart from each other on a part of the second planarization layer 116*b* having a smaller thickness. That is, an end of the bank BB and an end of the third planarization layer 116*c* can be disposed on a part of the second planarization layer 116*b* having a smaller thickness formed by a halftone mask process to be spaced apart from each other.

Further, the bank BB can be formed of an opaque material to reduce color mixture between the sub pixels SP and for example, can be formed of black resin, but is not limited thereto. In addition, a thickness of a part of the bank BB disposed in the contact holes of the third planarization layer 116*c* and the second planarization layer 116*b* to cover a part of the second connection electrode CE2 and a thickness of a part disposed on the second planarization layer 116*b* can be different from each other. Specifically, when the part of the bank BB covers a part of the second connection electrode CE2 disposed in the contact holes of the third planarization layer 116*c* and the second planarization layer 116*b*, since the contact hole is formed from the second passivation layer 115*b* to the third planarization layer 116*c*, the bank BB can be disposed below the light emitting diode 130, that is, disposed to be lower than the light emitting diode 130. Therefore, the thickness of the part of the bank BB covering a part of the second connection electrode CE2 disposed in the contact holes of the third planarization layer 116*c* and the second planarization layer 116*b* can be larger than the thickness of a part of the bank BB disposed on the second planarization layer 116*b*.

In addition, a first protection layer 117 is disposed on the first connection electrode CE1, the second connection electrode CE2, and the bank BB. In particular, the first protection layer 117 is for protecting components below the first protection layer 117, and can be configured by a single layer or a double layer of translucent epoxy, silicon oxide SiOx or silicon nitride SiNx, but is not limited thereto.

Figure 6:
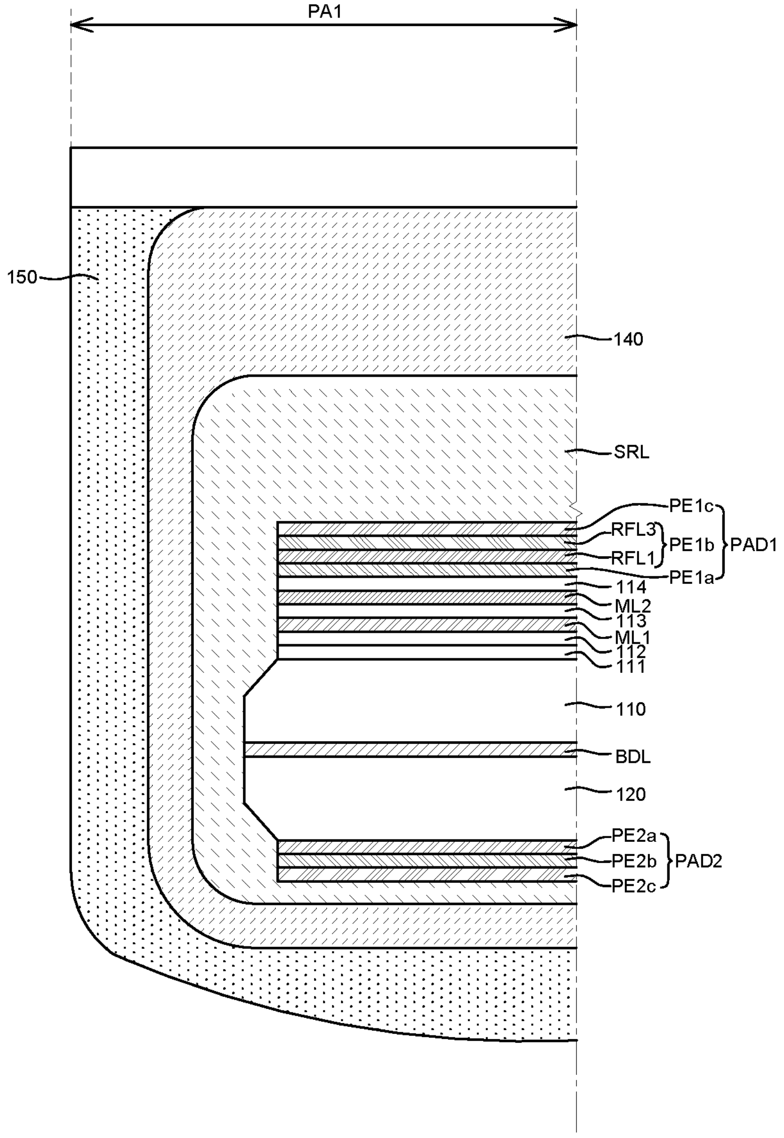
FIG. 6 is a cross-sectional view of a pad area of a display device according to an exemplary embodiment of the present disclosure.

Next, FIG. 6 is a cross-sectional view of a pad area of a display device according to an exemplary embodiment of the present disclosure. Referring to FIG. 6, first pad electrodes PAD1 are disposed in a first pad area PA1 of the first substrate 110. Each first pad electrode PAD1 can be configured by a plurality of conductive layers. For example, each first pad electrode PAD1 includes a first conductive layer PE1*a*, a second conductive layer PE1*b*, and a third conductive layer PE1*c*.

First, the first conductive layer PE1*a* is disposed on the second interlayer insulating layer 114. In particular, the first conductive layer PE1*a* can be formed of the same conductive material as the source electrode SE and the drain electrode DE and for example, can be configured by copper (Cu), aluminum (Al), molybdenum (Mo), nickel (Ni), titanium (Ti), chrome (Cr), or an alloy thereof, for example.

In addition, a second conductive layer PE1*b* is disposed on the first conductive layer PE1*a*. The second conductive layer PE1*b* can be formed of the same conductive material as the reflection plate. For example, the second conductive layer PE1*b* can include a conductive layer formed of the same material as the second part RF1-2 of the 1-2-th reflection plate RF1*b*, the 1-1-th reflection plate RF1*a*, the second part RF2-2 of the 2-2-th reflection plate RF2*b*, the 2-1-th reflection plate RF2*a*, the second part RF3-2 of the third reflection plate RF3, and the second part RF4-2 of the fourth reflection plate RF4 of the reflection plates. That is, the second conductive layer PE1*b* can be formed by a double layer of titanium and indium tin oxide (ITO).

In addition, the third conductive layer PE1*c* is disposed on the second conductive layer PE1*b*. In particular, the third conductive layer PE1*c* can be formed of the same conductive material as the first connection electrode CE1 and the second connection electrode CE2, and for example, a transparent conductive material, such as indium tin oxide (ITO) or indium zinc oxide (IZO).

Further, some of the conductive layers of the first pad electrode PAD1 can be electrically connected to wiring lines on the first substrate 110 to supply various signals to wiring lines and a sub pixels SP. For example, the first conductive layer PE1*a* and/or the second conductive layer PE1*b* of the first pad electrode PAD1 are connected to the data line DL, the high potential power line VL1, the low potential power line VL2, and the like disposed in the active area AA to transmit signals thereto.

In addition, a first metal layer ML1, a second metal layer ML2, and a plurality of insulating layers can be disposed together below the first pad electrode PAD1. In particular, the first metal layer ML1, the second metal layer ML2, and the insulating layers are disposed below the first pad electrode PAD1 to adjust a step of the first pad electrode PAD1. For example, the buffer layer 111, the gate insulating layer 112, the first metal layer ML1, the first interlayer insulating layer 113, and the second metal layer ML2 can be sequentially disposed between the first pad electrode PAD1 and the first substrate 110. The first metal layer ML1 can also be formed of the same conductive material as the gate electrode GE and the second metal layer ML2 can be formed of the same conductive material as the 1-2-th capacitor electrode C1*b*. However, the plurality of insulating layers, the first metal layer ML1, and the second metal layer ML2 below the first pad electrode PAD1 can be omitted depending on a design and are not limited thereto.

Further, a second substrate 120 is disposed below the first substrate 110 and supports components disposed below the display device 100 and can be an insulating substrate. For example, the second substrate 120 can be formed of glass resin, or the like. Further, the second substrate 120 can include polymer or plastic. Also, the second substrate 120 can be formed of the same material as the first substrate 110. In some embodiments, the second substrate 120 can be formed of a plastic material having flexibility.

In addition, a bonding layer BDL is disposed between the first substrate 110 and the second substrate 120. The bonding layer BDL can be formed of a material which is cured by various curing methods to bond the first substrate 110 and the second substrate 120. The bonding layer BDL can also be disposed only in a partial area between the first substrate 110 and the second substrate 120 or can be disposed in the entire area therebetween.

In addition, second pad electrodes PAD2 are disposed on a rear surface of the second substrate 120. In particular, the second pad electrodes PAD2 transmit a signal from a driving component disposed on the rear surface of the second substrate 120 to the side lines SRL and first pad electrodes PAD1 and the wiring lines on the first substrate 110. The second pad electrodes PAD2 are disposed in an end portion of the second substrate 120 in the non-active area NA to be electrically connected to the side line SRL which covers the end portion of the second substrate 120.

Further, the second pad electrodes PAD2 can be also disposed so as to correspond to the pad areas. Also, the first pad electrodes PAD1 can be disposed to correspond to the second pad electrodes PAD2, respectively, and then the first pad electrode PAD1 and the second pad electrode PAD2 which overlap each other can be electrically connected through the side line SRL.

In addition, each second pad electrode PAD2 includes a plurality of conductive layers. For example, each second pad electrode PAD2 includes a fourth conductive layer PE2*a*, a fifth conductive layer PE2*b*, and a sixth conductive layer PE2*c*.

First, the fourth conductive layer PE2*a* is disposed below the second substrate 120. Also, the fourth conductive layer PE2*a* can be configured by a conductive material such as copper (Cu), aluminum (Al), molybdenum (Mo), nickel (Ni), titanium (Ti), chrome (Cr), or an alloy thereof, for example. In addition, the fifth conductive layer PE2*b* is disposed below the fourth conductive layer PE2*a*. The fifth conductive layer PE2*b* can be configured by a conductive material, such as copper (Cu), aluminum (Al), molybdenum (Mo), nickel (Ni), titanium (Ti), chrome (Cr), or an alloy thereof, but is not limited thereto.

Further, the sixth conductive layer PE2*c* is disposed below the fifth conductive layer PE2*b*. The sixth conductive layer PE2*c* can be formed of a conductive material, for example, a transparent conductive material, such as indium tin oxide (ITO) or indium zinc oxide (IZO), for example.

In addition, the second protection layer 121 is disposed in the remaining area of the second substrate 120. In particular, the second protection layer 121 can protect various wiring lines and driving components disposed on the second substrate 120. The second protection layer 121 can also be configured by an organic insulating material, and for example, configured by benzocyclobutene or an acrylic organic insulating material, but is not limited thereto.

Also, a driving component including flexible films and a printed circuit board can be disposed on a rear surface of the second substrate 120. The flexible films are components in which various components such as a data driver IC are disposed on a base film having a ductility to supply signals to the sub pixels SP. The printed circuit board is electrically connected to the flexible films to supply signals to the driving IC. In addition, various components for supplying signals to the driving IC are disposed on the printed circuit board.

For example, the fourth conductive layer PE2*a* and/or the fifth conductive layer PE2*b* of the second pad electrode PAD2 extend to the flexible films disposed on the rear surface of the second substrate 120 to be electrically connected to the flexible films. The flexible films can supply various signals to the side lines SRL, the first pad electrodes PAD1, the wiring lines, and the sub pixels SP through the second pad electrode PAD2. Therefore, the signal from the driving component can be transmitted to the signal line and the sub pixels SP on the front surface of the first substrate 110 through the second pad electrodes PAD2 of the second substrate 120, the side line SRL, and the first pad electrodes PAD1 of the first substrate 110. In addition, the second pad area PA2 can be also disposed with the same structure as the first pad area PA1.

Next, the side lines SRL are disposed on the side surfaces of the first substrate 110 and the second substrate 120. The side lines SRL can electrically connect the first pad electrodes PAD1 disposed on the top surface of the first substrate 110 and the second pad electrodes PAD2 disposed on the rear surface of the second substrate 120. Also, the side lines SRL can be disposed so as to enclose the side surface of the display device 100. Each of the side lines SRL can cover the first pad electrode PAD1 at an end portion of the first substrate 110, a side surface of the first substrate 110, a side surface of the second substrate 120, and the second pad electrode PAD2 at an end portion of the second substrate 120. For example, the side lines SRL can be formed by a pad printing method using a conductive ink, for example, including silver (Ag), copper (Cu), molybdenum (Mo), and chrome (Cr).

In addition, a side insulating layer 140 which covers the side lines SRL is also disposed. In particular, the side insulating layer 140 can be disposed on the top surface of the first substrate 110, the side surface of the first substrate 110, the side surface of the second substrate 120, and the rear surface of the second substrate 120 to cover the side line SRL. The side insulating layer 140 can protect the side lines SRL.

In addition, when the side lines SRL are formed of a metal material, there can be a problem in that external light is reflected from the side lines SRL or light emitted from the light emitting diode 130 is reflected from the side lines SRL to be visibly recognized by the user. Therefore, the side insulating layer 140 can be configured to include a black material to suppress reflection of the external light. For example, the side insulating layer 140 can be formed by a pad printing method using an insulating material including a black material, for example, a black ink.

In addition, a seal member 150 which covers the side insulating layer 140 is disposed. In particular, the seal member 150 is disposed so as to enclose the side surface of the display device 100 to protect the display device 100 from external impacts, moisture and oxygen, or the like. For example, the seal member 150 can be formed of polyimide (PI), poly urethane, epoxy, or acryl based insulating material.

In addition, an optical film MF is disposed on the seal member 150, the side insulating layer 140, and the first protection layer 117. In particular, the optical film MF can be a functional film which implements a higher quality of images while protecting the display device 100. For example, the optical film MF can include an anti-scattering film, an anti-glare film, an anti-reflecting film, a low-reflecting film, an OLED transmittance controllable film, a polarizer, or the like.

In addition, an adhesive layer can be further disposed between the optical film MF and the seal member 150 and the side insulating layer 140 and the first protection layer 117, in FIGS. 5A to 6. Alternatively, the optical film MF can be also defined to include an adhesive layer disposed therebelow.

Also, an edge of the seal member 150 and an edge of the optical film MF can be disposed on the same line. In addition, the optical film MF having a larger size is attached above the first substrate 110 during the manufacturing process of the display device 100 and the seal member 150 which covers the side insulating layer 140 can be formed. Thereafter, laser can be irradiated on the seal member 150 and the optical film MF corresponding to an edge of the display device 100 to cut a part of the seal member 150 and the optical film MF. Accordingly, the size of the display device 100 is adjusted by an outer periphery cutting process of the seal member 150 and the optical film MF and the edge of the display device 100 can be formed to be flat.

Since the light formed in the emission layer of the light emitting diode is emitted to all the directions so that light excluding light emitted to the front surface of the panel is not emitted, but can be lost. Therefore, the reflection plate is located below the light emitting diode to reflect the light emitted from the emission layer toward the front surface of the panel, thereby improving the reflectance of the display device. Further, the electrode of the light emitting diode and the driving circuit and the signal line can be electrically connected by means of the reflection plate. Therefore, the reflection plate also serves as an electrode. Accordingly, the reflection plate requires a low resistance together with a high reflectance and also requires a reliability for long-term driving.

However, there are limitations in satisfying both the electrical characteristic and the optical characteristic. For example, when an aluminum alloy is disposed between the transparent electrodes to be used as a reflection plate, the reflectance is high, but aluminum ions precipitate during high-temperature operation, causing electrical connection between other electrodes and the reflection plate in the display device. Therefore, when an aluminum metal and a transparent electrode on the aluminum metal are disposed to be used as a reflection plate, the reflectance is high. However, an aluminum oxide film Al2O3 is naturally generated between the indium tin oxide ITO which is widely used for the transparent electrode and the aluminum.

Further, the aluminum oxide film Al2O3 serves as an insulator. Accordingly, there can be problems in that the electrical characteristic is degraded and a screen failure can be caused during the panel operation. Therefore, when a structure in which a molybdenum metal layer is inserted between indium tin oxide (ITO) which is a transparent electrode and aluminum is used as the reflection plate, the generation of the aluminum oxide film as described above is reduced to suppress the degradation of the electrical characteristic. However, molybdenum has a problem of lower reflectance than the other metal layers.

Therefore, in the display device 100 according to the exemplary embodiment of the present disclosure, the reflection plate can be disposed with a dual structure. For example, the first part RF1-1 of the 1-2-th reflection plate RF1*b*, the first part RF2-1 of the 2-2-th reflection plate RF2*b*, the first part RF3-1 of the third reflection plate RF3, and the first part RF4-1 of the fourth reflection plate RF4 overlap the red light emitting diode 130R, the green red light emitting diode 130G, and the blue red light emitting diode 130B to mainly serve to reflect light emitted from the red light emitting diode 130R, the green red light emitting diode 130G, and the blue red light emitting diode 130B. Further, the second part RF1-2 of the 1-2-th reflection plate RF1*b*, the 1-1-th reflection plate RF1*a*, the second part RF2-2 of the 2-2-th reflection plate RF2*b*, the 2-1-th reflection plate RF2*a*, the second part RF3-2 of the third reflection plate RF3, and the second part RF4-2 of the fourth reflection plate RF4 mainly serve to provide electrical connection.

The first part RF1-1 of the 1-2-th reflection plate RF1*b*, the first part RF2-1 of the 2-2-th reflection plate RF2*b*, the first part RF3-1 of the third reflection plate RF3*b*, and the first part RF4-1 of the fourth reflection plate RF4*b* and the second part RF1-2 of the 1-2-th reflection plate RF1*b*, the 1-1-th reflection plate RF1*a*, the second part RF2-2 of the 2-2-th reflection plate RF2*b*, the 2-1-th reflection plate RF2*a*, the second part RF3-2 of the third reflection plate RF3, and the second part RF4-2 of the fourth reflection plate RF4 can have different laminated structures. For example, the first part RF1-1 of the 1-2-th reflection plate RF1*b*, the first part RF2-1 of the 2-2-th reflection plate RF2*b*, the first part RF3-1 of the third reflection plate RF3, and the first part RF4-1 of the fourth reflection plate RF4 include a first layer L1 formed of titanium (Ti), a second layer L2 which is formed of aluminum (Al) having a higher reflectance than titanium (Ti), and a third layer L3 which is formed of indium tin oxide (ITO).

Therefore, light emitted from the light emitting diode 130 can be efficiently reflected above the display device 100 by the second layer L2 having a high reflectance. Further, the second part RF1-2 of the 1-2-th reflection plate RF1*b*, the 1-1-th reflection plate RF1*a*, the second part RF2-2 of the 2-2-th reflection plate RF2*b*, the 2-1-th reflection plate RF2*aa*, the second part RF3-2 of the third reflection plate RF3, and the second part RF4-2 of the fourth reflection plate RF4 include a first layer L1 formed of titanium (Ti) and a third layer L3 which is formed of indium tin oxide (ITO), but do not include a second layer L2 which is formed of aluminum (Al). Therefore, the formation of aluminum oxide film Al2O3 between aluminum (Al) and indium tin oxide (ITO) is suppressed to improve the electrical characteristic.

Accordingly, in the display device 100 according to the embodiment of the present disclosure, in an area overlapping the light emitting diode 130, the light emission efficiency of the display device 100 can be increased by the high reflectance of the first part RF1-1 of the 1-2-th reflection plate RF1*b*, the first part RF2-1 of the 2-2-th reflection plate RF2*b*, the first part RF3-1 of the third reflection plate RF3, and the first part RF4-1 of the fourth reflection plate RF4.

Further, the electrical characteristic can be improved by the second part RF1-2 of the 1-2-th reflection plate RF1*b*, the 1-1-th reflection plate RF1*a*, the second part RF2-2 of the 2-2-th reflection plate RF2*b*, the 2-1-th reflection plate RF2*a*, the second part RF3-2 of the third reflection plate RF3, and the second part RF4-2 of the fourth reflection plate RF4 which are electrically connected to the light emitting diode 130 at the outside of the light emitting diode 130.

The present disclosure provides a substrate including an active area in which sub pixels are disposed and a non-active area. The display device further includes a light emitting diodes disposed in each sub pixel. The display device further includes transistors disposed in each of the sub pixels. The display device further includes reflection plates disposed below the light emitting diodes in the sub pixels. Some of the reflection plates includes a first part overlapping the light emitting diode and a second part extending from the first part, and the first part and the second part are formed of different materials from each other.

In addition, a reflectance of the first part can be higher than a reflectance of the second part. The first part can include a plurality of layers, and the second part may include some of the plurality of layers. The first part can include a first layer, a second layer disposed on the first layer, and a third layer disposed on the second layer. The second part can include the first layer and the third layer.

The sub pixels can include a first sub pixel, a second sub pixel, a third sub pixel, and a fourth sub pixel. The reflection plates can include a first reflection plate disposed in the first sub pixel, a second reflection plate disposed in the second sub pixel, a third reflection plate disposed in the third sub pixel, and a fourth reflection plate disposed in the fourth sub pixel. The first reflection plate can include a 1-2-th reflection plate overlapping a light emitting diode disposed in the first sub pixel and a 1-1-th reflection plate spaced apart from the 1-2-th reflection plate. The second reflection plate can include a 2-2-th reflection plate overlapping a light emitting diode disposed in the second sub pixel and a 2-1-th reflection plate spaced apart from the 2-2-th reflection plate.

The 1-1-th reflection plate and the 2-1-th reflection plate each can include the first layer and the third layer and the 1-2-th reflection plate. The 2-2-th reflection plate each can include the first layer, the second layer, and the third layer. 7. The 1-2-th reflection plate and the 2-2-th reflection plate each can include the first part and the second part.

The 1-1-th reflection plate and the 2-1-th reflection plate can be connected to the transistor. The 1-2th reflection plate and the 2-2th reflection plate can be connected to a high potential power line. The light emitting diode disposed in the first sub pixel and the light emitting diode disposed in the second sub pixel can include a second semiconductor layer doped with a p-type impurity and a first semiconductor layer which is disposed on the second semiconductor layer and is doped with an n-type impurity.

In addition, the light emitting diode disposed in the first sub pixel and the light emitting diode disposed in the second sub pixel can be red light emitting diodes. The third reflection plate and the fourth reflection plate can include the first layer, the second layer, and the third layer. The third reflection plate and the fourth reflection plate can include the first part and the second part. The third reflection plate and the fourth reflection plate can be connected to the transistors.

A light emitting diode disposed in the third sub pixel and a light emitting diode disposed in the fourth sub pixel can include a first semiconductor layer doped with an n-type impurity and a second semiconductor layer which is disposed on the first semiconductor layer and is doped with a p-type impurity. Also, a light emitting diode disposed in the third sub pixel can be a green light emitting diode, and a light emitting diode disposed in the fourth sub pixel can be a blue light emitting diode.

In addition, the second layer can be formed of a material having a reflectance higher than those of the first layer and the third layer. Also, the first layer and the second layer can be formed of a metal material and the third layer can be formed of a transparent conductive oxide. Further, the first layer can be formed of titanium, the second layer can be formed of aluminum, and the third layer can be formed of indium tin oxide (ITO). The first layer and the third layer can also be disposed to enclose a top surface, a side surface, and a bottom surface of the second layer.

The display device can further comprise a planarization layer which covers the light emitting diodes, wherein a contact hole through which the reflection plate is exposed is disposed on the planarization layer and the contact hole is disposed in an area overlapping the second part. In addition, the display device can further comprise a pad electrodes which is disposed in the non-active area and is connected to the sub pixels, wherein the pad electrodes is formed of the same material as the second part.

Active layers of the transistors can be formed of oxide semiconductor, amorphous silicon, or polysilicon. The active area further can include a gate driving areas which extends from the sub pixels and include a gate driver disposed therein and the active layers of the transistors disposed in the gate driver can be formed of oxide semiconductor, amorphous silicon, or polysilicon. The transistors disposed in the gate driver can include active layers formed of different materials.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a display panel including an active area and a non-active area extended from an active area, wherein the active area includes:

a plurality of pixel areas including a plurality of sub pixels; and a plurality of gate driving areas including gate drivers disposed in the active area in a gate-in-active-area (GIA) structure, wherein each sub pixel of the plurality of sub pixels includes:

at least one light emitting diode including a first semiconductor layer, an emission layer, and a second semiconductor layer, a first electrode disposed on an upper surface of the first semiconductor layer, and a second electrode disposed on an upper surface of the second semiconductor layer;

at least one transistor configured to drive the at least one light emitting diode to emit light; and a reflection plate including a first part disposed below and overlapping the at least one light emitting diode, and a second part extending from the first part;

a planarization layer disposed on the reflection plate and covering at least one light emitting diode;

a plurality of first connection electrodes which electrically connect a high potential power line and the second electrode of the at least one light emitting diode through contact holes disposed in the planarization layer;

a plurality of second connection electrodes which electrically connect the at least one transistor and the first electrode of the at least one light emitting diode through contact holes disposed in the planarization layer; and a bank including a black material, and covering parts of the plurality of first connection electrodes and the plurality of second connection electrodes disposed in the contact holes of the planarization layer, and wherein a material of the first part of the reflection plate is different than a material of the second part of the reflection plate.

2. The display device according to claim 1, wherein the first part of the reflection plate includes a material having a higher reflectance than a material of the second part extending from the first part.

3. The display device according to claim 1, wherein the first part of the reflection plate comprises a first layer, a second layer and a third layer, and wherein the second part of the reflection plate comprises the first layer and third layer.

4. The display device according to claim 3, wherein the first part of the reflection plate comprises the second layer formed on the first layer, and the third layer formed on top and side surfaces of the second layer, and wherein the second part of the reflection plate comprises the third layer formed on the first layer without the second layer therebetween.

5. The display device according to claim 4, wherein the plurality of sub pixels includes a first sub pixel with a first light emitting diode, a second sub pixel with a second light emitting diode, a third sub pixel with a third light emitting diode, and a fourth sub pixel with a fourth light emitting diode, wherein the reflection plate includes a first reflection plate disposed in the first sub pixel, a second reflection plate disposed in the second sub pixel, a third reflection plate disposed in the third sub pixel, and a fourth reflection plate disposed in the fourth sub pixel, wherein the first reflection plate includes a 1-2-th reflection plate overlapping the first light emitting diode disposed in the first sub pixel and a 1-1-th reflection plate spaced apart from the 1-2-th reflection plate, and wherein the second reflection plate includes a 2-2-th reflection plate overlapping the second light emitting diode disposed in the second sub pixel and a 2-1-th reflection plate spaced apart from the 2-2-th reflection plate.

6. The display device according to claim 5, wherein each of the 1-1-th reflection plate and the 2-1-th reflection plate includes the first layer and the third layer, and the 1-2-th reflection plate and the 2-2-th reflection plate each includes the first layer, the second layer, and the third layer.

7. The display device according to claim 6, wherein each of the 1-2-th reflection plate and the 2-2-th reflection plate include the first part and the second part.

8. The display device according to claim 6, wherein the first sub pixel includes a first transistor and the second sub pixel includes a second transistor, wherein the 1-1-th reflection plate is connected to the first transistor, and the 2-1-th reflection plate is connected to the second transistor, and wherein the 1-2-th reflection plate and the 2-2-th reflection plate are connected to the high potential power line.

9. The display device according to claim 8, wherein the first light emitting diode disposed in the first sub pixel and the second light emitting diode disposed in the second sub pixel include the second semiconductor layer doped with a p-type impurity and the first semiconductor layer disposed on the second semiconductor layer and doped with an n-type impurity.

10. The display device according to claim 6, wherein the first light emitting diode disposed in the first sub pixel and the second light emitting diode disposed in the second sub pixel are red light emitting diodes.

11. The display device according to claim 5, wherein each of the third reflection plate and the fourth reflection plate include the first layer, the second layer, and the third layer.

12. The display device according to claim 11, wherein the third reflection plate and the fourth reflection plate include the first part and the second part.

13. The display device according to claim 11, wherein the third sub pixel includes a third transistor and the fourth sub pixel includes a fourth transistor, and wherein the third reflection plate is connected to the third transistor and the fourth reflection plate is connected to the fourth transistor.

14. The display device according to claim 13, wherein the third light emitting diode disposed in the third sub pixel and the fourth light emitting diode disposed in the fourth sub pixel include the first semiconductor layer doped with an n-type impurity and the second semiconductor layer disposed on the first semiconductor layer and doped with a p-type impurity.

15. The display device according to claim 11, wherein the third light emitting diode disposed in the third sub pixel is a green light emitting diode and the fourth light emitting diode disposed in the fourth sub pixel is a blue light emitting diode.

16. The display device according to claim 4, wherein the second layer is formed of a material having a reflectance higher than those of the first layer and the third layer.

17. The display device according to claim 4, wherein the first layer and the second layer are formed of a metal material and the third layer is formed of a transparent conductive oxide.

18. The display device according to claim 4, wherein the first layer is formed of titanium, the second layer is formed of aluminum, and the third layer is formed of indium tin oxide (ITO).

19. The display device according to claim 4, wherein the first layer and the third layer are disposed to enclose a top surface, a side surface, and a bottom surface of the second layer.

20. The display device according to claim 1, wherein the planarization layer includes a contact hole exposing and overlapping the second part of the reflection plate.

21. The display device according to claim 1, further comprising:

a plurality of pad electrodes disposed in the non-active area, wherein the pad electrodes are connected to the plurality of sub pixels, and wherein the plurality of pad electrodes are formed of a same material as the second part of the reflection plate.

22. The display device according to claim 1, wherein the at least one transistor includes an active layer formed of oxide semiconductor, amorphous silicon, or polysilicon.

23. The display device according to claim 22, wherein the plurality of gate driving areas extend from the plurality of sub pixels and are disposed between adjacent ones of the plurality of pixel areas, and wherein active layers of transistors disposed in the gate drivers are formed of oxide semiconductor, amorphous silicon, or polysilicon.

24. The display device according to claim 23, wherein the transistors disposed in the gate drivers include active layers formed of different materials from each other.

25. The display device according to claim 23, wherein the active layers of the transistors disposed in the gate drivers are formed of a same material as an active layer of the at least one transistor included in the plurality of sub pixels.

* * * * *